(12) United States Patent
Jo et al.

(10) Patent No.: US 12,550,379 B2
(45) Date of Patent: Feb. 10, 2026

(54) THIN FILM TRANSISTOR SUBSTRATE AND DISPLAY DEVICE COMPRISING THE SAME

(71) Applicant: LG Display Co., Ltd., Seoul (KR)

(72) Inventors: Kwangmin Jo, Paju-si (KR); GiSang Hong, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 641 days.

(21) Appl. No.: 17/895,920

(22) Filed: Aug. 25, 2022

(65) Prior Publication Data

US 2023/0076478 A1   Mar. 9, 2023

(30) Foreign Application Priority Data

Sep. 3, 2021 (KR) .................. 10-2021-0117992
Dec. 29, 2021 (KR) .................. 10-2021-0190668

(51) Int. Cl.
*H10D 30/67* (2025.01)
*H10K 59/121* (2023.01)

(52) U.S. Cl.
CPC ..... *H10D 30/6755* (2025.01); *H10K 59/1213* (2023.02)

(58) Field of Classification Search
CPC .......... H10D 30/6755; H10D 30/6723; H10D 30/6757; H10D 86/423; H10D 86/431; H10D 86/471; H10D 86/60; H10K 59/1213
See application file for complete search history.

(56) References Cited

U.S. PATENT DOCUMENTS

| | | | |
|---|---|---|---|
| 10,586,815 B2 | 3/2020 | Lee | |
| 10,692,948 B2 | 6/2020 | Li | |
| 10,866,475 B2 * | 12/2020 | Saitoh | ............... H10D 30/6755 |
| 10,937,813 B2 | 3/2021 | Matsukizono | |
| 11,695,016 B2 * | 7/2023 | Daitoh | .................. H10D 86/60 |
| | | | 257/59 |
| 2015/0076471 A1 | 3/2015 | Saito et al. | |
| 2015/0228803 A1 | 8/2015 | Koezuka et al. | |
| 2016/0322402 A1 | 11/2016 | Kim et al. | |
| 2017/0309649 A1 | 10/2017 | Hayashi | |

FOREIGN PATENT DOCUMENTS

KR   10-2019-0080207 A   7/2019

OTHER PUBLICATIONS

European Patent Office, Extended European Search Report, European Patent Application No. 22193724.6, Jul. 24, 2023, seven pages.
European Patent Office, Examination Report, European Patent Application No. 22193724.6, Nov. 28, 2025, five pages.

* cited by examiner

*Primary Examiner* — Tan N Tran
(74) *Attorney, Agent, or Firm* — Fenwick & West LLP

(57) ABSTRACT

A thin film transistor substrate and a display device comprising the same are provided. The thin film transistor substrate comprises a first thin film transistor and a second thin film transistor on a base substrate, wherein the first thin film transistor includes a first active layer on the base substrate, and a first gate electrode spaced apart from the first active layer, the second thin film transistor includes a second active layer on the base substrate, and a second gate electrode spaced apart from the second active layer, and a mobility of the first active layer is greater than a mobility of the second active layer.

25 Claims, 18 Drawing Sheets

THIN FILM TRANSISTOR SUBSTRATE AND DISPLAY DEVICE COMPRISING THE SAME

CROSS-REFERENCE TO RELATED APPLICATIONS

This application claims priority to Republic of Korea Patent Application No. 10-2021-0117992 filed on Sep. 3, 2021, and Republic of Korea Patent Application No. 10-2021-0190668 filed on Dec. 29, 2021, each of which are hereby incorporated by reference in its entirety.

BACKGROUND

Field of Technology

The present disclosure relates to a thin film transistor substrate and a display device comprising the same, and more particularly, to a thin film transistor substrate comprising a first thin film transistor and a second thin film transistor, which have different current characteristics, and a display device comprising the thin film transistor substrate.

Discussion of the Related Art

A display device has become more important with the development of multimedia, and a flat panel display device such as a liquid crystal display device, a plasma display device and an organic light emitting display device has been commercially used.

The flat panel display device may include a gate driver for sequentially supplying scan signals to a plurality of pixels. The gate driver includes a plurality of stages that include multiple transistors, and the stages are connected in a cascade to sequentially output scan signals. The output scan signals are transferred to a plurality of pixels through a gate line.

The flat panel display device may further include an emission control circuit for driving a light emission control line connected to an emission control transistor provided in a pixel. The emission control circuit may be connected to a stage that generates a scan signal, and may be disposed in the gate driver.

Recently, a gate in panel (GIP) structure in which a gate driver is embedded in a display panel in the form of a thin film transistor has been applied. When the GIP structure is applied, a slim size of the display device may be obtained, external esthetic appearance of the display device may be improved, and a manufacturing cost of the display device may be reduced.

In this GIP structure, the gate driver is disposed on a base substrate, a large number of thin film transistors are disposed in the gate driver to improve performance of the display device, whereas an area of the gate driver needs to be reduced to reduce a bezel area. Therefore, there is a need for a gate driver having high performance and a narrow area.

In addition, when an internal compensation circuit is formed in the display panel, the number of thin film transistors disposed in the display panel is increased. Therefore, there is a need for a method for disposing an area of a large number of thin film transistors in the display panel.

SUMMARY

The present disclosure has been made in view of the above problems, and it is an object of the present disclosure to provide a thin film transistor substrate that may dispose a large number of thin film transistors in the same area.

It is another object of the present disclosure to provide a thin film transistor substrate that simultaneously includes a thin film transistor having high mobility and high current characteristics and a thin film transistor having excellent stability.

It is still another object of the present disclosure to provide a method capable of reducing an area of a gate driver by disposing a thin film transistor having high mobility and high current characteristics in the gate driver.

It is further still another object of the present disclosure to provide a display device having excellent display characteristics by applying a thin film transistor having excellent stability to a pixel. Also, a thin film transistor having high mobility and high current characteristics is applied to a pixel to reduce its area, so that a large number of thin film transistors may be disposed to be integrated in the display device.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of a thin film transistor substrate comprising: a first thin film transistor on a base substrate, the first thin film transistor including a first active layer on the base substrate and a first gate electrode that is spaced apart from the first active layer; and a second thin film transistor on the base substrate, the second thin film transistor including a second active layer on the base substrate and a second gate electrode that is spaced apart from the second active layer, wherein a mobility of the first active layer is greater than a mobility of the second active layer.

In one embodiment, a thin film transistor substrate comprises: a first thin film transistor on a base substrate, the first thin film transistor including a first active layer on the base substrate and a first gate electrode that is spaced apart from the first active layer, the first active layer including a first oxide semiconductor layer and a second oxide semiconductor layer; and a second thin film transistor on the base substrate, the second thin film transistor including a second active layer on the base substrate and a second gate electrode that is spaced apart from the second active layer, the second active layer including a first oxide semiconductor layer and a second oxide semiconductor layer; wherein a mobility of the first oxide semiconductor layer of the first active layer and a mobility of the first semiconductor layer of the second active layer are greater than a mobility of the second oxide semiconductor layer of the first active layer and a mobility of the second oxide semiconductor layer of the second active layer, wherein the first gate electrode in the first thin film transistor is closer to the first oxide semiconductor layer of the first active layer than the second oxide semiconductor layer of the first active layer, and the second gate electrode in the second thin film transistor is closer to the second oxide semiconductor layer of the second active layer than the first oxide semiconductor layer of the second active layer.

In one embodiment, a thin film transistor substrate comprises: a first thin film transistor on a base substrate, the first thin film transistor including a first active layer on the base substrate and a first gate electrode that is spaced apart from the first active layer by a first distance; and a second thin film transistor on the base substrate, the second thin film transistor including a second active layer on the base substrate and a second gate electrode that is spaced apart from the second active layer by a second distance that is greater than the first distance, wherein a mobility of the first active layer is greater than a mobility of the second active layer.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION

Figure 1:
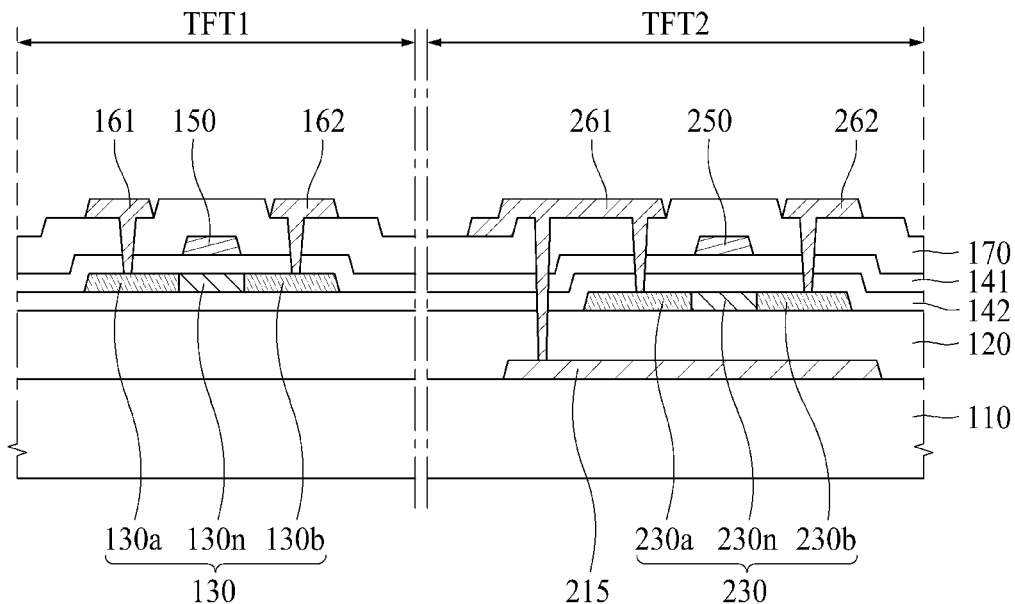
FIG. 1 is a cross-sectional view illustrating a thin film transistor substrate according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

Spatially relative terms such as "below", "beneath", "lower", "above", and "upper" may be used herein to easily describe a relationship of one element or elements to another element or elements as illustrated in the figures. It will be understood that these terms are intended to encompass different orientations of the device in addition to the orientation depicted in the figures. For example, if the element illustrated in the figure is reversed, the element described to be arranged "below", or "beneath" another device may be arranged "above" another element. Therefore, an exemplary term "below or beneath" may include "below or beneath" and "above" orientations. Likewise, an exemplary term "above" or "on" may include "above" and "below or beneath" orientations.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the drawings, the same or similar elements are denoted by the same reference numerals even though they are depicted in different drawings.

In the embodiments of the present disclosure, a source electrode and a drain electrode are distinguished from each other, for convenience of description. However, the source electrode and the drain electrode may be used interchangeably. The source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In some embodiments of the present disclosure, for convenience of description, a source region is distinguished from a source electrode, and a drain region is distinguished from a drain electrode. However, the embodiments of the present disclosure are not limited to this structure. For example, a source region may be a source electrode, and a drain region may be a drain electrode. Also, a source region may be a drain electrode, and a drain region may be a source electrode.

FIG. 1 is a cross-sectional view illustrating a thin film transistor substrate 100 according to one embodiment of the present disclosure.

The thin film transistor substrate 100 according to one embodiment of the present disclosure includes a first thin film transistor TFT1 and a second thin film transistor TFT2 on a base substrate 110.

Glass or plastic may be used as the base substrate 110 in one embodiment. A transparent plastic having a flexible property, (e.g., polyimide) may be used as the plastic. When the polyimide is used as the base substrate 110, a heat-resistant polyimide capable of enduring a high temperature may be used considering that a high temperature deposition process is performed on the base substrate 110.

A light shielding layer 215 may be disposed on the base substrate 110. The light shielding layer 215 shields light incident from the outside to protect the thin film transistor TFT2.

The light shielding layer 215 may overlap at least one of the first thin film transistor TFT1 or the second thin film transistor TFT2. The light shielding layer 215 that overlaps the second thin film transistor TFT2 is shown in FIG. 1, but one embodiment of the present disclosure is not limited thereto, and the light shielding layer (see FIG. 2) that overlaps the first thin film transistor TFT1 may be disposed. The light shielding layer 215 may be omitted.

The light shielding layer 215 may be electrically connected to any one of source electrodes 161 and 261 and drain electrodes 162 and 262 of the thin film transistors TFT1 and TFT2.

Although not shown in FIG. 1, a light shielding layer that overlaps the first active layer 130 may be disposed on the base substrate 110. This light shielding layer may be connected to the source electrode 161 of the first thin film transistor TFT1, and may be connected to the drain electrode 162 of the first thin film transistor TFT1. Also, the light shielding layer may be connected to a first gate electrode 150 of the first thin film transistor TFT1. The light shielding layer may be connected to the first gate electrode 150, so that the first thin film transistor TFT1 may have the same structure as a double gate electrode.

A buffer layer 120 is disposed on the light shielding layer 215. The buffer layer 120 may be made of an insulating material in one embodiment. For example, the buffer layer 120 may include at least one of insulating materials such as a silicon oxide, a silicon nitride and a metal-based oxide. The buffer layer 120 may have a single layered structure, or may have a multi-layered structure.

The buffer layer 120 may protect the active layers 130 and 230 by blocking the air and water. Also, a surface on the base substrate 110 on which the light shielding layer 215 is disposed may become uniform by the buffer layer 120.

Referring to FIG. 1, the first thin film transistor TFT1 and the second thin film transistor TFT2 may be disposed on the buffer layer 120.

The first thin film transistor TFT1 may include a first active layer 130 on the base substrate 110 and a first gate electrode 150 spaced apart from the first active layer 130. The first gate electrode 150 at least partially overlaps the first active layer 130.

The second thin film transistor TFT2 may include a second active layer 230 on the base substrate 110 and a second gate electrode 250 spaced apart from the second active layer 230. The second gate electrode 250 at least partially overlaps the second active layer 230.

According to one embodiment of the present disclosure, the first active layer 130 may have mobility higher (e.g., greater) than that of the second active layer 230. As a result, the first thin film transistor TFT1 may have excellent current characteristics.

Referring to FIG. 1, the second active layer 230 may be disposed on the buffer layer 120.

According to one embodiment of the present disclosure, the second active layer 230 may be formed of a semiconductor material. The second active layer 230 includes an oxide semiconductor material.

According to one embodiment of the present disclosure, the second active layer 230 may be made of an oxide semiconductor material known as having low mobility characteristics, for example.

According to one embodiment of the present disclosure, the second active layer 230 may have excellent film stability. The second active layer 230 may include gallium (Ga) to have excellent film stability in one embodiment. Gallium (Ga) may improve reliability of a thin film transistor by allowing an active layer made of an oxide semiconductor material to have excellent film stability.

Indium (In) may serve to increase mobility of an oxide semiconductor, and gallium (Ga) may serve to improve film stability. Therefore, when the second active layer 230 includes indium (In) and gallium (Ga), a concentration % of gallium (Ga) may be set to be greater than or equal to that of indium (In) based on the number of atoms [Ga concentration≥In concentration].

Examples of an oxide semiconductor material having low mobility characteristics and excellent film stability may include an IGZO(InGaZnO)-based oxide semiconductor material [Ga concentration≥In concentration], a GZO (GaZnO)-based oxide semiconductor material, an IGO(InGaO)-based oxide semiconductor material, and a GZTO (GaZnSnO)-based oxide semiconductor material.

According to one embodiment of the present disclosure, the second active layer 230 may include at least one of an IGZO-based oxide semiconductor material [Ga concentration≥In concentration], a GZO-based oxide semiconductor material, an IGO-based oxide semiconductor material, or a GZTO-based oxide semiconductor material.

According to one embodiment of the present disclosure, the second active layer 230 may have mobility of about 10 cm$^2$/V·s. In more detail, the second active layer 230 may have mobility of 5 to 15 cm$^2$/V·s.

Since the second active layer 230 has relatively low mobility compared to the first active layer 130, a magnitude of a current change amount with respect to a gate voltage change is not great at a threshold voltage period of the second thin film transistor TFT2. Therefore, the second thin film transistor TFT2 may have a large s-factor (stability factor).

The second thin film transistor TFT2, which includes a second active layer 230 having relatively low mobility but having excellent film stability, may have excellent driving stability and an excellent s-factor. Therefore, the second thin film transistor TFT2 according to one embodiment of the present disclosure may be usefully used as, for example, a driving transistor or an emission control transistor of a display device.

The second active layer 230 may include a channel portion 230n, a first connection portion 230a, and a second connection portion 230b. The first connection portion 230a may be connected to one side (e.g., a first side) of the channel portion 230n, and the second connection portion 230b may be connected to the other side of the channel portion 230n (e.g., a second side).

The channel portion 230n of the second active layer 230 overlaps the second gate electrode 250.

The first connection portion 230a and the second connection portion 230b may be formed by selective conductorization of the second active layer 230.

Referring to FIG. 1, a second gate insulating layer 142 is disposed on the second active layer 230. The second gate insulating layer 142 may be disposed on the second active layer 230 and the buffer layer 120.

According to one embodiment of the present disclosure, the first active layer 130 may be disposed on the second gate insulating layer 142. Referring to FIG. 1, the first active layer 130 and the second active layer 230 may be disposed on their respective layers different from each other.

The first active layer 130 may have mobility higher than that of the second active layer 230.

According to one embodiment of the present disclosure, in order to have excellent mobility, the first active layer 130 may be made of, for example, an oxide semiconductor material known as having high mobility characteristics.

Examples of the oxide semiconductor material having high mobility characteristics include, for example, an IGZO (InGaZnO)-based oxide semiconductor material [In concentration>Ga concentration], an IZO(InZnO)-based oxide semiconductor material, an IGZTO(InGaZnSnO)-based oxide semiconductor material, an ITZO(InSnZnO)-based oxide semiconductor material, an FIZO(FeInZnO)-based oxide semiconductor material, a ZnO-based oxide semiconductor material, a SIZO(SiInZnO)-based oxide semiconductor material, and a ZnON(Zn-Oxynitride)-based oxide semiconductor material.

According to one embodiment of the present disclosure, the first active layer 130 may include at least one of an IGZO-based oxide semiconductor material [In concentration>Ga concentration], an IZO-based oxide semiconductor material, an IGZTO-based oxide semiconductor material, an ITZO-based oxide semiconductor material, a FIZO-based oxide semiconductor material, a ZnO-based oxide semiconductor material, a SIZO-based oxide semiconductor material, or a ZnON-based oxide semiconductor material.

According to one embodiment of the present disclosure, the first active layer 130 may have mobility of 20 cm$^2$/V·s or more. In detail, the first active layer 130 may have mobility of about 20 to about 50 cm$^2$/V·s. In more detail, the first active layer 130 may have mobility in the range of 20 to 40 cm$^2$/V·s or 20 to 30 cm$^2$/V·s.

According to one embodiment of the present disclosure, the first active layer 130 may have mobility higher than that of the second active layer 230 as much as 5 to 45 cm$^2$/V·s. In more detail, the first active layer 130 may have higher mobility as much as 10 to 30 cm$^2$/V·s, higher mobility as much as 10 to 20 cm$^2$/V·s, or higher mobility as much as 20 to 30 cm$^2$/V·s than the second active layer 230.

As the first active layer 130 and the second active layer 230 have their respective mobility that is different from each other, the first thin film transistor TFT1 and the second thin film transistor TFT2 may be distinguished depending on their purpose of uses. In addition, the mobility of the first active layer 130 and the second active layer 230 may be adjusted, respectively, depending on to the purpose of uses of the first thin film transistor TFT1 and the second thin film transistor TFT2. The mobility of the first active layer 130 and the second active layer 230 may vary depending on a type of semiconductor material applied to the first active layer 130 and the second active layer 230 and a processing method thereof. For example, the mobility of the first active layer 130 and the second active layer 230 may vary depending on a method or intensity of plasma treatment applied to the first active layer 130 and the second active layer 230.

The first active layer 130 including an oxide semiconductor material having high mobility characteristics may have excellent mobility, and the first thin film transistor TFT1 may have excellent current characteristics. Since the first active layer 130 has excellent mobility, even though a width of the first active layer 130 is not great, a current may actively flow through the first active layer 130. Therefore, a total area of the first thin film transistor TFT1 may be reduced, and a plurality of first thin film transistors TFT1 may be disposed to be integrated in a narrow area.

The first thin film transistor TFT1 having excellent mobility and excellent current characteristics may be used as a switching transistor of a display device, and may be usefully used as a thin film transistor of a gate driver.

The first active layer 130 includes a channel portion 130n, a first connection portion 130a, and a second connection portion 130b. The first connection portion 130a may be connected to one side (e.g., a first side) of the channel portion 130n, and the second connection portion 130b may be connected to the other side (e.g., a second side) of the channel portion 130n.

The channel portion 130n overlaps the first gate electrode 150.

The first connection portion 130a and the second connection portion 130b may be formed by selective conductorization of the first active layer 130.

A first gate insulating layer 141 is disposed on the first active layer 130. The first gate insulating layer 141 may include at least one of a silicon oxide, a silicon nitride, or a metal-based oxide. The first gate insulating layer 141 may have a single layered structure, or may have a multi-layered structure.

Referring to FIG. 1, the first gate insulating layer 141 may be disposed on the first active layer 130 and the second gate insulating layer 142. The first gate insulating layer 141 may cover the entire area above the base substrate 110.

The first gate electrode 150 and the second gate electrode 250 are disposed on the first gate insulating layer 141. The first gate electrode 150 and the second gate electrode 250 may be made together by the same process using the same material. The first gate electrode 150 and the second gate electrode 250 may have the same thickness. However, one embodiment of the present disclosure is not limited to this example, and the first gate electrode 150 and the second gate electrode 250 may be made of different materials or by different processes.

The first gate electrode 150 is spaced apart from the first active layer 130 to at least partially overlap the first active layer 130. The first gate electrode 150 overlaps the channel portion 130n of the first active layer 130.

The second gate electrode 250 is spaced apart from the second active layer 230 to at least partially overlap the second active layer 230. The second gate electrode 250 overlaps the channel portion 230n of the second active layer 230.

According to one embodiment of the present disclosure, the first gate insulating layer 141 is disposed between the first active layer 130 and the first gate electrode 150 and between the second active layer 230 and the second gate electrode 250. The first gate insulating layer 141 may be integrally formed to be extended from a portion between the first active layer 130 and the first gate electrode 150 to a portion between the second active layer 230 and the second gate electrode 250.

Referring to FIG. 1, the second gate insulating layer 142 is disposed between the second active layer 230 and the second gate electrode 250. The second gate insulating layer 142 is also disposed between the first active layer 130 and the base substrate 110. The second gate insulating layer 142 is extended from a portion between the second active layer 230 and the second gate electrode 250 to a portion between the first active layer 130 and the base substrate 110.

Referring to FIG. 1, the first active layer 130 is disposed on the second gate insulating layer 142, and the second active layer 230 is disposed below the second gate insulating layer 142. As described above, the first active layer 130 and the second active layer 230 may be disposed in their respective layers different from each other. According to one embodiment of the present disclosure, a lower portion of any one of the first active layer 130 and the second active layer 230 refers to a direction directed toward the base substrate 110, and an upper portion of any one thereof refers to an opposite direction of the base substrate 110.

According to one embodiment of the present disclosure, even though the first gate electrode 150 and the second gate electrode 250 are disposed in the same layer, a distance between the first gate electrode 150 and the first active layer 130 and a distance between the second gate electrode 250 and the second active layer 230 may be different. For example, a distance between the second gate electrode 250 and the second active layer 230 is greater than a distance between the first gate electrode 150 and the first active layer 130. As a result, a difference between an electric field applied to the first active layer 130 and an electric field applied to the second active layer 230 may be generated, and a difference in current characteristics between the first thin film transistor TFT1 and the second thin film transistor TFT2 may be remarkably generated.

An interlayer insulating layer 170 may be disposed on the first gate electrode 150 and the second gate electrode 250. The interlayer insulating layer 170 is an insulating layer made of an insulating material. The interlayer insulating layer 170 may be made of an organic material, or may be made of an inorganic material, or may be made of a stacked body of an organic layer and an inorganic layer.

The source electrodes 161 and 261 and the drain electrodes 162 and 262 may be disposed on the interlayer insulating layer 170.

The source electrode 161 and the drain electrode 162 of the first thin film transistor TFT1 are spaced apart from each other and connected to the first active layer 130, respectively. The source electrode 261 and the drain electrode 262 of the second thin film transistor TFT2 are spaced apart from each other and connected to the second active layer 230, respectively.

The source electrodes 161 and 261 and the drain electrodes 162 and 262 may be connected to the first and second active layers 130 and 230 through a contact hole formed in the interlayer insulating layer 170.

Each of the source electrodes 161 and 261 and the drain electrodes 162 and 262 may include at least one of molybdenum (Mo), aluminum (Al), chromium (Cr), gold (Au), titanium (Ti), nickel (Ni), neodymium (Nd), copper (Cu), or their alloy. The source electrodes 161 and 261 and the drain electrodes 162 and 262 may be formed of a single layer made of a metal or a metal alloy, or may be formed of two or more layers.

According to one embodiment of the present disclosure, one of the first connection portions 130a and 230a and the second connection portions 130b and 230b may be a source area, and the other one may be a drain area. The source area may serve as a source connection portion connected to the source electrodes 161 and 261. The drain area may serve as a drain connection portion connected to the drain electrodes 162 and 262.

The first connection portions 130a and 230a and the second connection portions 130b and 230b shown in the drawings are only distinguished for convenience of description, and the first connection portions 130a and 230a and the second connection portions 130b and 230b may be used interchangeably.

The light shielding layer 215 may be connected to nay one of the source electrodes 161 and 261 and the drain electrodes 162 and 262 through a contact hole.

The first thin film transistor TFT1 may be formed by the first active layer 130, the first gate electrode 150, the source electrode 161 and the drain electrode 162, and the second thin film transistor TFT2 may be formed by the second active layer 230, the second gate electrode 250, the source electrode 261 and the drain electrode 262.

Figure 2:
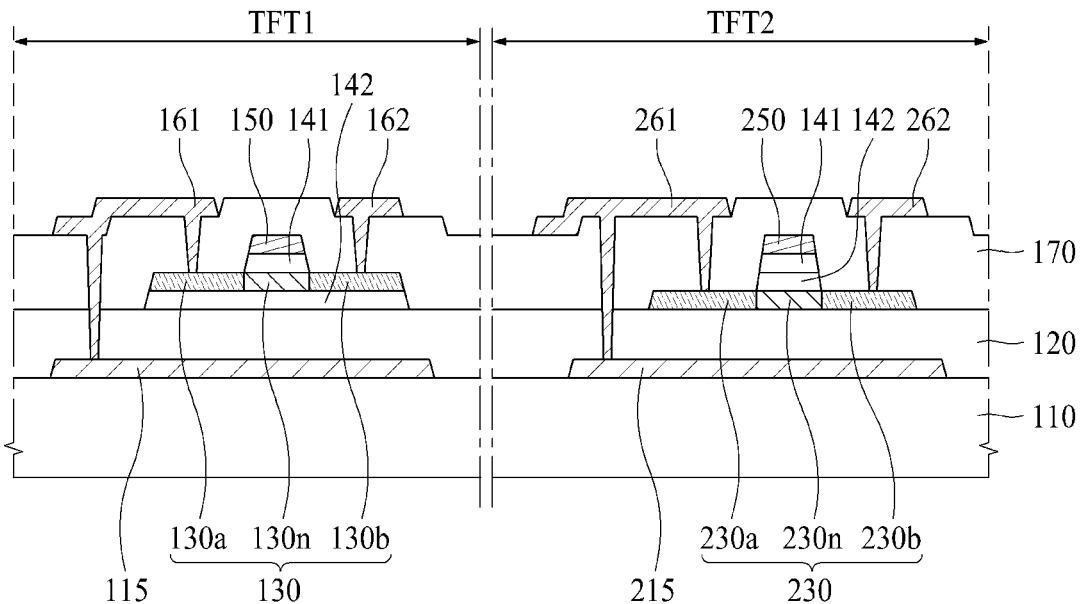
FIG. 2 is a cross-sectional view illustrating a thin film transistor substrate according to another embodiment of the present disclosure.

FIG. 2 is a cross-sectional view illustrating a thin film transistor substrate 200 according to another embodiment of the present disclosure. Hereinafter, in order to avoid redundancy, a description of the elements already described will be omitted.

Referring to FIG. 2, the first gate insulating layer 141 and the second gate insulating layer 142 may be patterned. The first gate insulating layer 141 and the second gate insulating layer 142 may be patterned by etching or ashing.

For example, the first gate insulating layer 141 disposed below the first gate electrode 150 may be patterned in a shape corresponding to the first gate electrode 150. The first gate insulating layer 141 and the second gate insulating layer 142, which are disposed below the second gate electrode 250, may be patterned in a shape corresponding to the second gate electrode 250. The second gate insulating layer 142 disposed below the first active layer 130 may be patterned in a shape corresponding to the first active layer 130.

Referring to FIG. 2, a light shielding layer 115 may also be disposed on the base substrate 110 in addition to the light shielding layer 215 described above. The light shielding layer 115 may be disposed to overlap the first active layer 130. The light shielding layer 115 may shield light incident from the outside to protect the first active layer 130. Referring to FIG. 2, the light shielding layer 115 may be connected to the source electrode 161 of the first thin film transistor TFT1. However, one embodiment of the present disclosure is not limited by the drawings, the light shielding layer 115 may be connected to the drain electrode 162 of the first thin film transistor TFT1. In addition, the light shielding layer 115 may be connected to the first gate electrode 150 of the first thin film transistor TFT1. When the light shielding layer 115 is connected to the first gate electrode 150, an effect of a double gate electrode may be generated.

Figure 3:
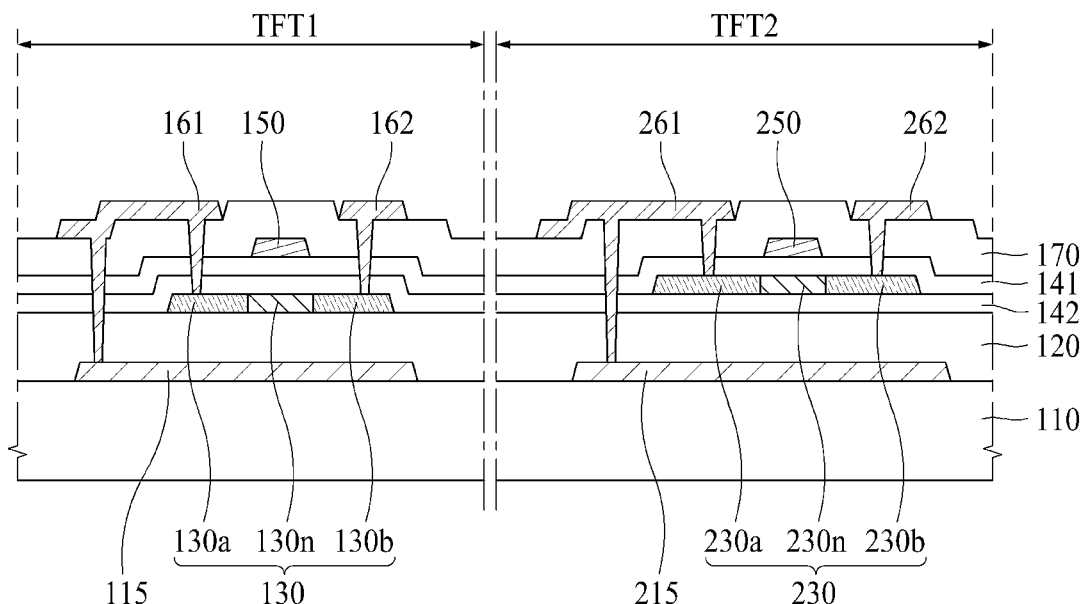
FIG. 3 is a cross-sectional view illustrating a thin film transistor substrate according to still another embodiment of the present disclosure.

FIG. 3 is a cross-sectional view illustrating a thin film transistor substrate 300 according to still another embodiment of the present disclosure.

Referring to FIG. 3, the arrangement positions of the first active layer 130 and the second active layer 230 may vary in comparison with FIG. 1.

According to still another embodiment of the present disclosure, a first gate insulating layer 141 may be disposed between the first active layer 130 and the first gate electrode 150 and between the second active layer 230 and the second gate electrode 250, and a second gate insulating layer 142 may be disposed between the first active layer 130 and the first gate electrode 150. The second gate insulating layer 142 is disposed between the second active layer 230 and the base substrate 110. In this way, the first active layer 130 and the second active layer 230 may be disposed in their respective layers different from each other.

Referring to FIG. 3, the first active layer 130 is disposed below the second gate insulating layer 142, the second active layer 230 is disposed on the second gate insulating layer 142, and the first gate electrode 150 and the second gate electrode 250 are disposed on the first gate insulating layer 141. Therefore, a distance between the first gate electrode 150 and the first active layer 130 is greater than a distance between the second gate electrode 250 and the second active layer 230. However, since the first active layer 130 has mobility higher than that of the second active layer 230, the first thin film transistor TFT1 may have greater current characteristics than the second thin film transistor TFT2.

Referring to FIG. 3, the light shielding layer 115 may be disposed between the first active layer 130 and the base substrate 110. The light shielding layer 115 may shield light incident from the outside to protect the first active layer 130.

Figure 4:
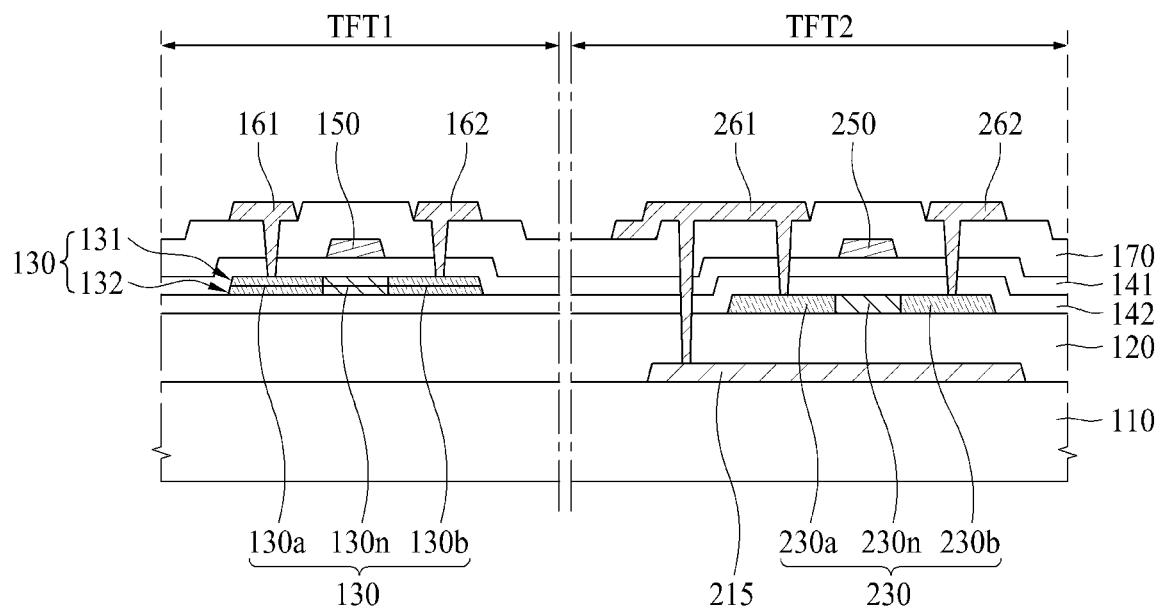
FIG. 4 is a cross-sectional view illustrating a thin film transistor substrate according to further still another embodiment of the present disclosure.

FIG. 4 is a cross-sectional view illustrating a thin film transistor substrate 400 according to further still another embodiment of the present disclosure.

According to further still another embodiment of the present disclosure, at least one of the first active layer 130 or the second active layer 230 may have a multi-layered structure.

Figure 5:
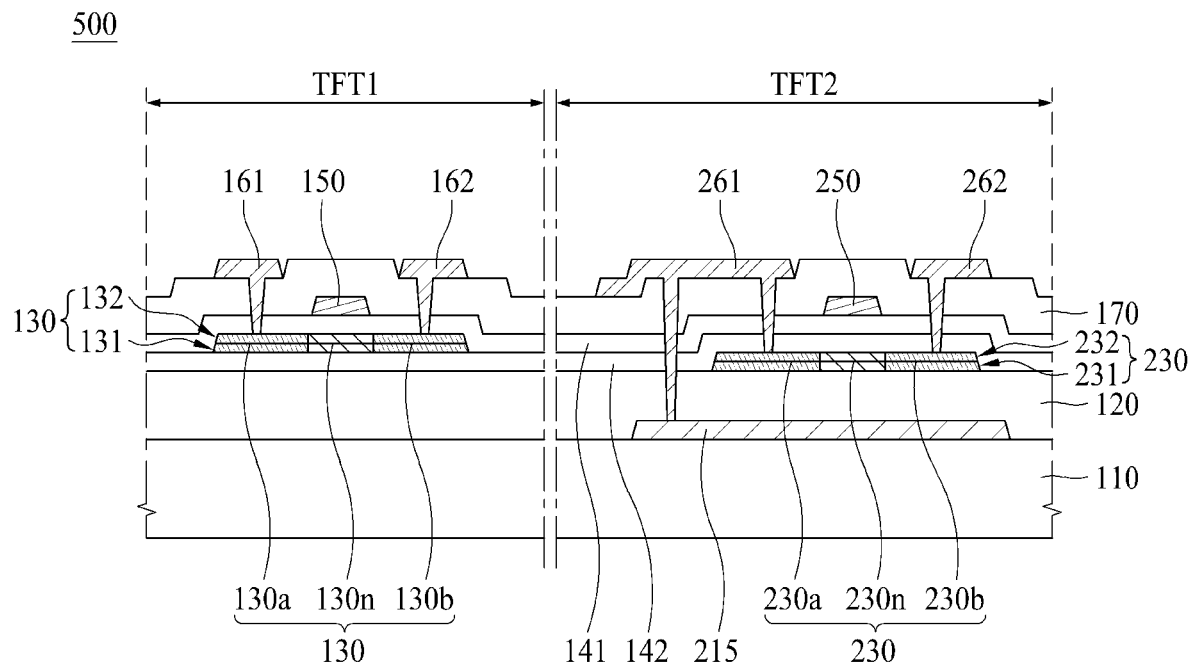
FIG. 5 is a cross-sectional view illustrating a thin film transistor substrate according to further still another embodiment of the present disclosure.

Referring to FIG. 4, the first active layer 130 has a multi-layered structure, but one embodiment of the present disclosure is not limited thereto, and the second active layer 230 may have a multi-layered structure (see FIG. 5).

According to further still another embodiment of the present disclosure, the first active layer 130 may include a first oxide semiconductor layer 131 and a second oxide semiconductor layer 132.

The first oxide semiconductor layer 131 may have mobility higher than that of the second oxide semiconductor layer 132 in the first active layer 130. The first oxide semiconductor layer 131 of the first active layer 130 may be made of an oxide semiconductor material having high mobility characteristics.

The first oxide semiconductor layer 131 of the first active layer 130 may include, for example, at least one of an IGZO(InGaZnO)-based oxide semiconductor material [In concentration>Ga concentration], an IZO(InZnO)-based oxide semiconductor material, an IGZTO(InGaZnSnO)-based semiconductor material, an ITZO(InSnZnO)-based oxide semiconductor material, a FIZO(FeInZnO)-based oxide semiconductor material, a ZnO-based semiconductor material, a SIZO(SiInZnO)-based oxide semiconductor material, a ZnON(Zn-Oxynitride)-based oxide semiconductor material, an IGO(InGaO)-based oxide semiconductor material, an ITO(InSnO)-based oxide semiconductor material, an IO(InO)-based oxide semiconductor material, a ZTO(ZnSnO)-based oxide semiconductor material, an IAZO(InAlZnO)-based oxide semiconductor material, an AZO(AlZnO)-based oxide semiconductor material, or an ATZO(AlSnZnO)-based oxide semiconductor material.

The second oxide semiconductor layer 132 of the first active layer 130 may be made of an oxide semiconductor material having excellent film stability. For example, the second oxide semiconductor layer 132 of the first active layer 130 may include at least one of an IGZO(InGaZnO)-based oxide semiconductor material [Ga concentration>In concentration], a GZO(GaZnO)-based oxide semiconductor material, an IGO(InGaO)-based oxide semiconductor material, a GZTO(GaZnSnO)-based oxide semiconductor material, an IZO(InZnO)-based oxide semiconductor material, an IGZTO(InGaZnSnO)-based semiconductor material, an ITZO(InSnZnO)-based oxide semiconductor material, a ZTO(ZnSnO)-based oxide semiconductor material, an IAZO(InAlZnO)-based oxide semiconductor material, an AZO(AlZnO)-based oxide semiconductor material, or an ATZO(AlSnZnO)-based oxide semiconductor material.

Referring to FIG. 4, the first oxide semiconductor layer 131 may be disposed on the second oxide semiconductor layer 132. In detail, the first oxide semiconductor layer 131 may be disposed to be closer to the first gate electrode 150 than the second oxide semiconductor layer 132, but further still another embodiment of the present disclosure is not limited thereto, and the second oxide semiconductor layer 132 may be disposed on the first oxide semiconductor layer 131 (see FIG. 5).

The second active layer 230 may be made of an oxide semiconductor material having excellent film stability. Since the second active layer 230 has been already described, a detailed description of the second active layer 230 will be omitted.

According to further still another embodiment of the present disclosure, since the first active layer 130 includes a first oxide semiconductor layer 131 having high mobility characteristics, the first active layer 130 may have mobility higher than that of the second active layer 230.

FIG. 5 is a cross-sectional view illustrating a thin film transistor substrate 500 according to further still another embodiment of the present disclosure.

As shown in FIG. 5, the second active layer 230 may include a first oxide semiconductor layer 231 and a second oxide semiconductor layer 232. The first oxide semiconductor layer 231 and the second oxide semiconductor layer 232 may have their respective mobility different from each other. Any one of the first oxide semiconductor layer 231 and the second oxide semiconductor layer 232 may have excellent film stability.

According to further still another embodiment of the present disclosure, the first oxide semiconductor layer 231 and the second oxide semiconductor layer 232 of the second active layer 230 may be made of an oxide semiconductor material having excellent film stability.

Referring to FIG. 5, the second oxide semiconductor layer 132 may be disposed on the first oxide semiconductor layer 131 in the first active layer 130. In detail, the second oxide semiconductor layer 132 may be disposed to be closer to the first gate electrode 150 than the first oxide semiconductor layer 131.

Figure 6:
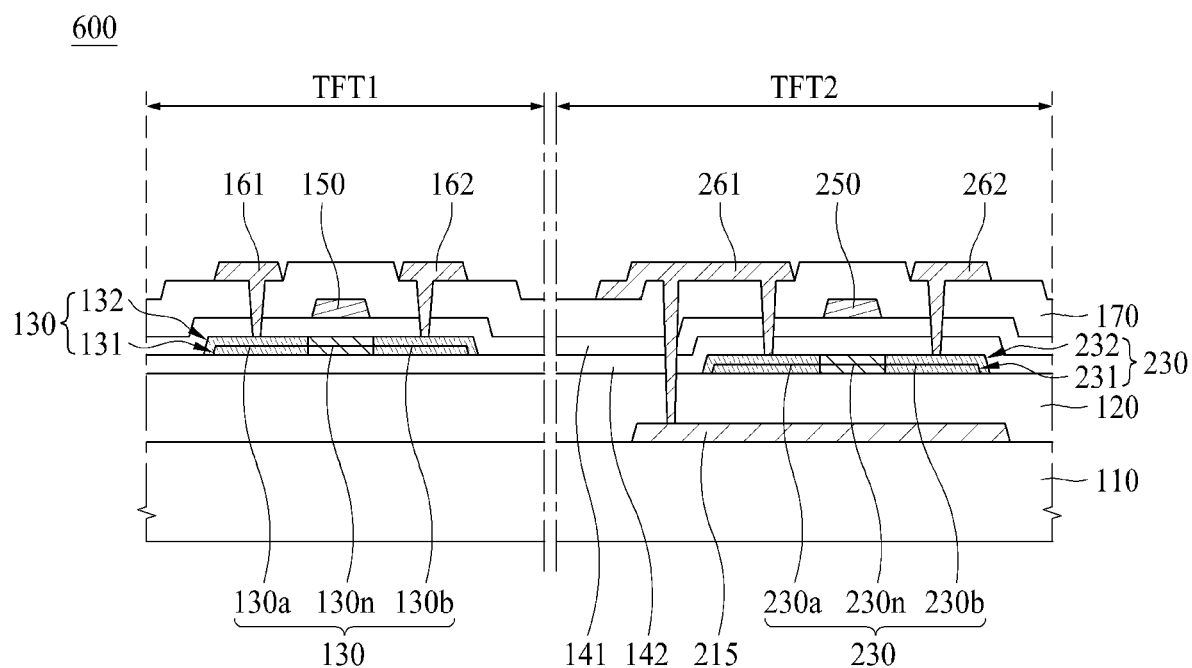
FIG. 6 is a cross-sectional view illustrating a thin film transistor substrate according to further still another embodiment of the present disclosure.

FIG. 6 is a cross-sectional view illustrating a thin film transistor substrate 600 according to further still another embodiment of the present disclosure.

Referring to FIG. 6, the first active layer 130 includes a first oxide semiconductor layer 131 and a second oxide semiconductor layer 132, and the second oxide semiconductor layer 132 may cover an upper surface and a lateral surface of the first oxide semiconductor layer 131.

According to further still another embodiment of the present disclosure, the second oxide semiconductor layer 132 having excellent stability may cover the upper surface and the a lateral surface of the first oxide semiconductor layer 131 having high mobility characteristics to protect the first oxide semiconductor layer 131.

Referring to FIG. 6, the second active layer 230 may include a first oxide semiconductor layer 231 and a second oxide semiconductor layer 232, and the second oxide semiconductor layer 232 may cover an upper surface and a lateral surface of the first oxide semiconductor layer 231.

The first oxide semiconductor layer 231 and the second oxide semiconductor layer 232 of the second active layer 230 may be made of an oxide semiconductor material having excellent film stability, and the second oxide semiconductor layer 232 may have more excellent film stability.

Figure 7:
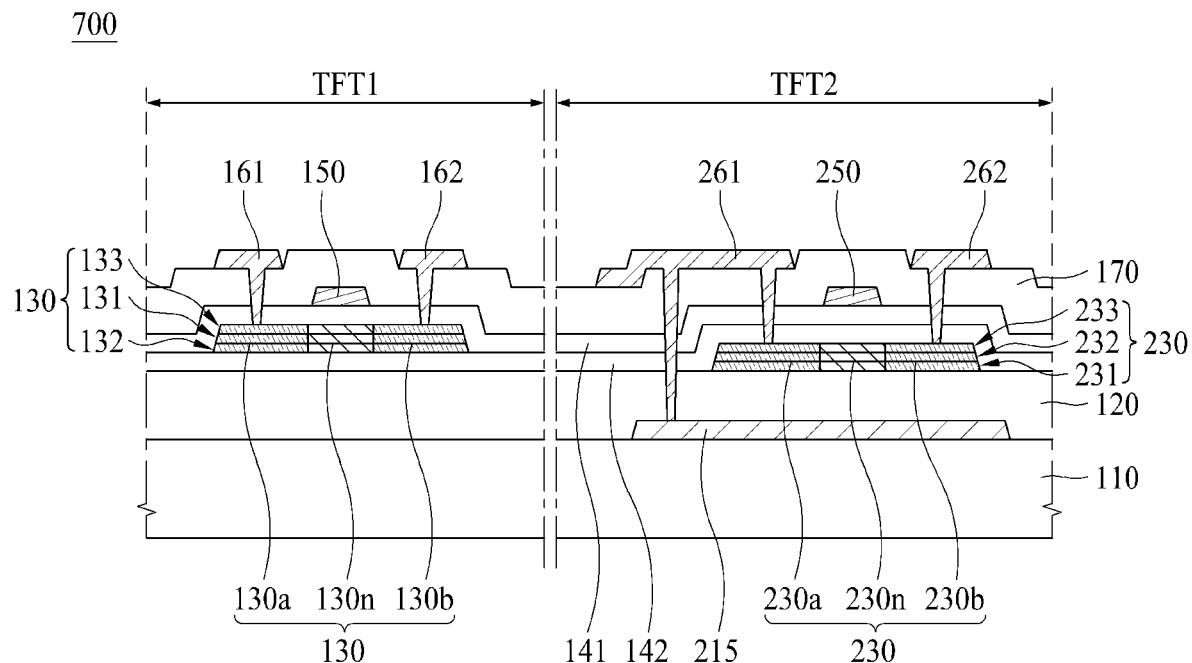
FIG. 7 is a cross-sectional view illustrating a thin film transistor substrate according to further still another embodiment of the present disclosure.

FIG. 7 is a cross-sectional view illustrating a thin film transistor substrate 700 according to further still another embodiment of the present disclosure.

According to further still another embodiment of the present disclosure, at least one of the first active layer 130 or the second active layer 230 may further include a third oxide semiconductor layer 133 or 233.

Referring to FIG. 7, the first active layer 130 of the first thin film transistor TFT1 may further include a third oxide semiconductor layer 133. According to further still another embodiment of the present disclosure, the third oxide semiconductor layer 133 of the first active layer 130 may be in contact with the first oxide semiconductor layer 131. The third oxide semiconductor layer 133 may have excellent film stability.

Referring to FIG. 7, the second active layer 230 of the second thin film transistor TFT2 may further include a third oxide semiconductor layer 233. The third oxide semiconductor layer 233 of the second active layer 230 may be in contact with the first oxide semiconductor layer 231. The third oxide semiconductor layer 233 may have excellent film stability.

According to further still another embodiment of the present disclosure, the first active layer 130 may include a first oxide semiconductor layer 131 having high mobility characteristics. Therefore, the first active layer 130 may have mobility higher than that of the second active layer 230.

Figure 8:
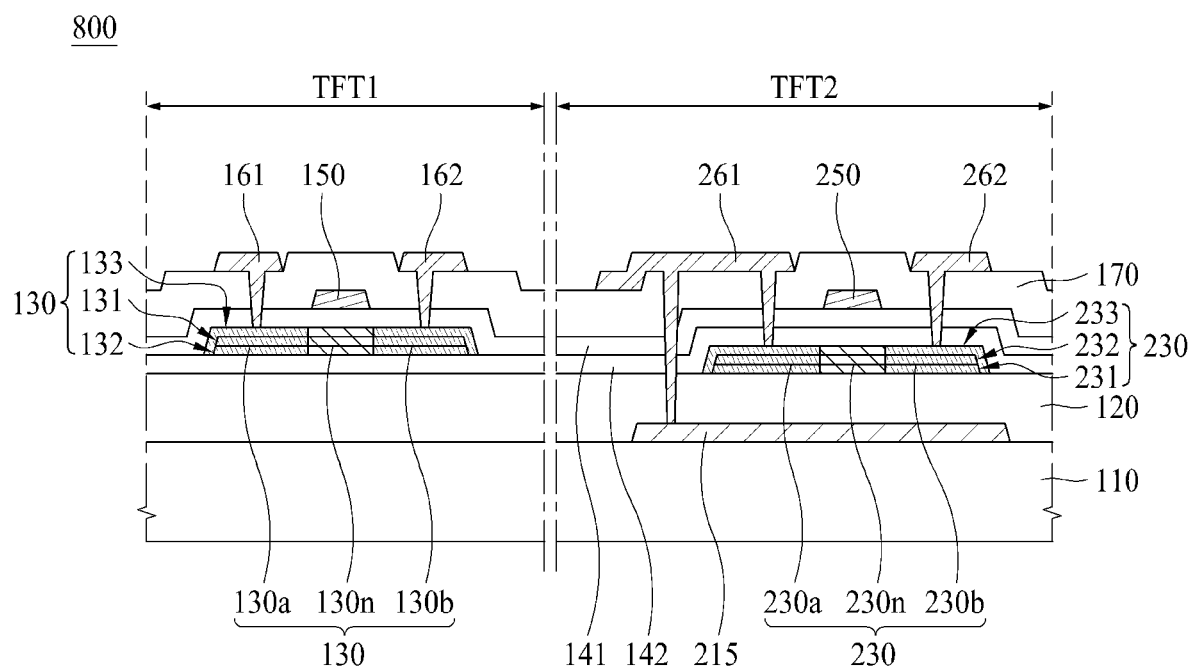
FIG. 8 is a cross-sectional view illustrating a thin film transistor substrate according to further still another embodiment of the present disclosure.

FIG. 8 is a cross-sectional view illustrating a thin film transistor substrate 800 according to further still another embodiment of the present disclosure.

Referring to FIG. 8, the first active layer 130 of the first thin film transistor TFT1 includes a first oxide semiconductor layer 131, a second oxide semiconductor layer 132, and a third oxide semiconductor layer 133. The third oxide semiconductor layer 133 may cover the upper surface and the a lateral surface of the first oxide semiconductor layer 131 and upper surface and a lateral surface of the second oxide semiconductor layer 132. The third oxide semiconductor layer 133 may serve as a protective layer.

Referring to FIG. 8, the second active layer 230 of the second thin film transistor TFT2 includes a first oxide semiconductor layer 231, a second oxide semiconductor layer 232, and a third oxide semiconductor layer 233. The third oxide semiconductor layer 233 may cover an upper surface and a lateral surface of the first oxide semiconductor layer 231 and an upper surface and a lateral surface of the second oxide semiconductor layer 232. The third oxide semiconductor layer 233 may serve as a protective layer.

Figure 9:
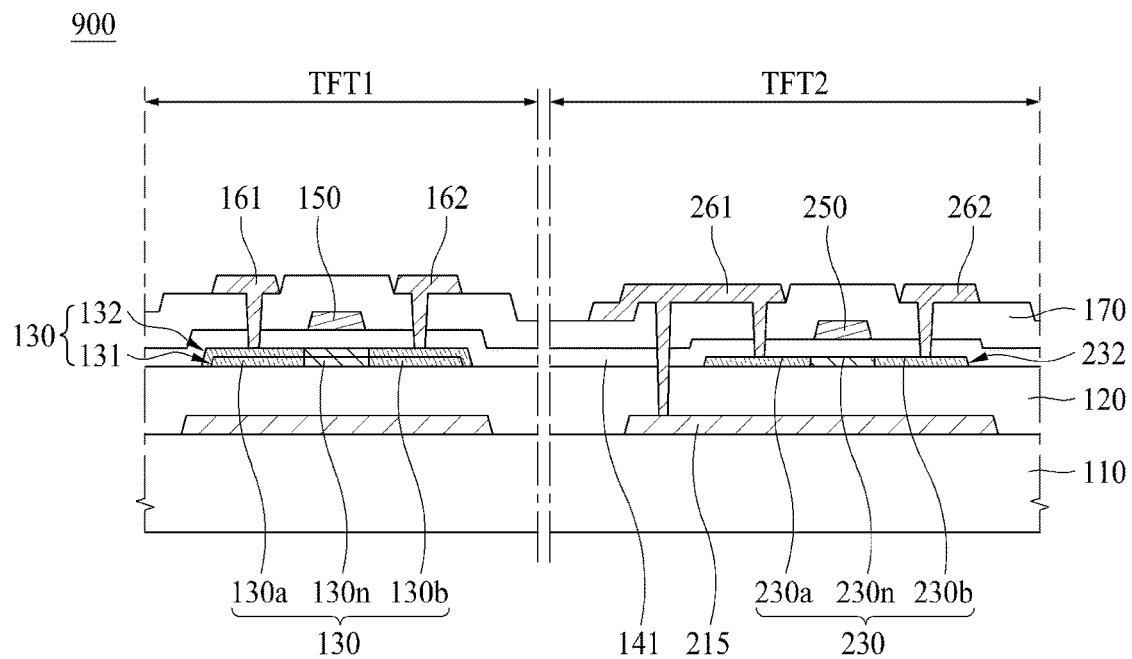
FIG. 9 is a cross-sectional view illustrating a thin film transistor substrate according to further still another embodiment of the present disclosure.

FIG. 9 is a cross-sectional view illustrating a thin film transistor substrate 900 according to another embodiment of the present disclosure.

Referring to FIG. 9, the first active layer 130 of the first thin film transistor TFT1 may include a first oxide semiconductor layer 131 and a second oxide semiconductor layer 132. In this case, the first oxide semiconductor layer 131 may have mobility higher than that of the second oxide semiconductor layer 132. The first oxide semiconductor layer 131 may include, for example, a high mobility oxide semiconductor material.

Referring to FIG. 9, the second active layer 230 of the second thin film transistor TFT2 may be disposed on the same layer as the first active layer 130. According to further still another embodiment of the present disclosure, the second active layer 230 may have the same composition as that of the second oxide semiconductor layer 132 of the first active layer 130.

The second active layer 230 may be formed by a material of forming the second oxide semiconductor layer 132 of the first active layer 130. For example, when the second oxide semiconductor layer 132 of the first active layer 130 is formed, the second active layer 230 may be formed together with the second oxide semiconductor layer 132. Therefore, according to one embodiment of the present disclosure, the second active layer 230 may be formed simultaneously with the second oxide semiconductor layer 132.

According to another embodiment of the present disclosure, the first oxide semiconductor layer 131 of the first active layer 130 may be first formed using the high mobility oxide semiconductor material, and the second oxide semiconductor layer 132 of the first active layer 130 and the second active layer 230 may be formed using an oxide semiconductor material having excellent stability.

Since the first active layer 130 includes the first oxide semiconductor layer 131 having high mobility characteristics, the first active layer 130 may have mobility higher than that of the second active layer 230.

Referring to FIG. 9, the second oxide semiconductor layer 132 of the first active layer 130 may cover an upper surface and a lateral surface of the first oxide semiconductor layer 131. Since the second oxide semiconductor layer 132 protects the first oxide semiconductor layer 131 having high mobility characteristics, stability of the first thin film transistor TFT1 may be improved.

Figure 10:
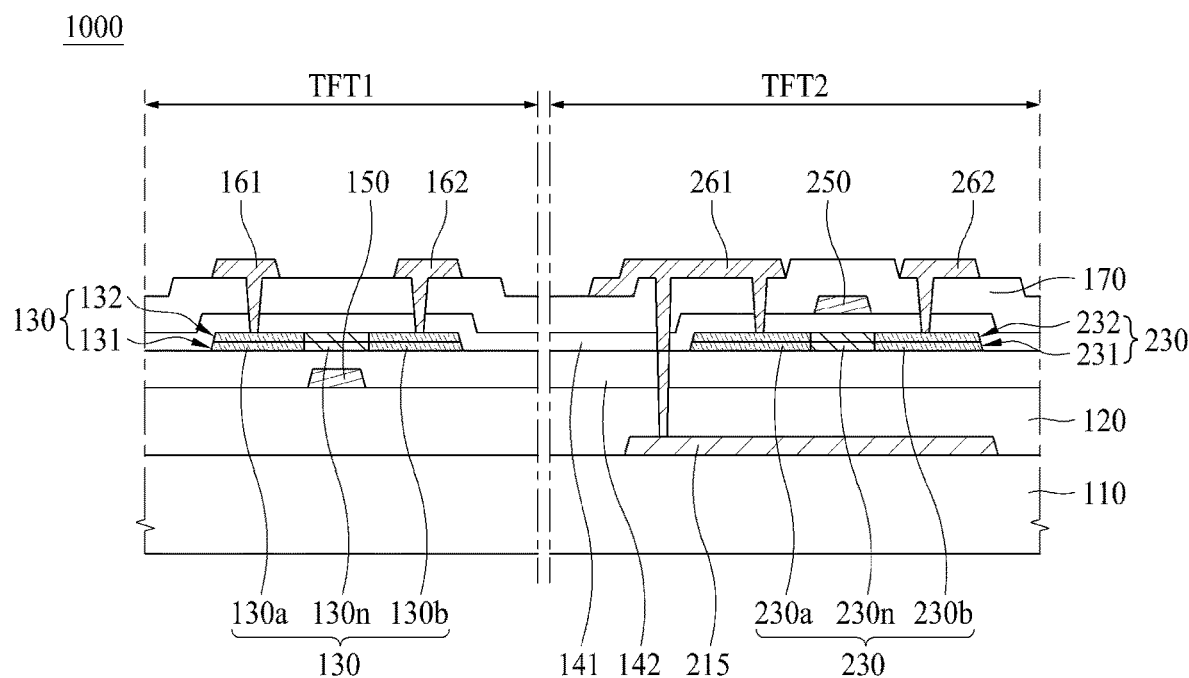
FIG. 10 is a cross-sectional view illustrating a thin film transistor substrate according to further still another embodiment of the present disclosure.

FIG. 10 is a cross-sectional view illustrating a thin film transistor substrate 1000 according to further still another embodiment of the present disclosure.

The thin film transistor substrate 1000 according to further still another embodiment of the present disclosure includes a first thin film transistor TFT1 and a second thin film transistor TFT2 on a base substrate 110.

The first thin film transistor TFT1 includes a first active layer 130 on the base substrate 110 and a first gate electrode 150 spaced apart from the first active layer 130. The second thin film transistor TFT2 includes a second active layer 230 on the base substrate 110 and a second gate electrode 250 spaced apart from the second active layer 230.

Referring to FIG. 10, the first active layer 130 and the second active layer 230 include first oxide semiconductor layers 131 and 231 and second oxide semiconductor layers 132 and 232, respectively. In detail, the first active layer 130 includes a first oxide semiconductor layer 131 and a second oxide semiconductor layer 132, and the second active layer 230 includes a first oxide semiconductor layer 231 and a second oxide semiconductor layer 232.

The first oxide semiconductor layer 131 of the first active layer 130 and the first oxide semiconductor layer 231 of the second active layer 230 may have the same composition. In addition, the second oxide semiconductor layer 132 of the first active layer 130 and the second oxide semiconductor layer 232 of the second active layer 230 may have the same composition.

Referring to FIG. 10, the first active layer 130 and the second active layer 230 may be disposed on the same layer. In detail, the first oxide semiconductor layer 131 of the first active layer 130 and the first oxide semiconductor layer 231 of the second active layer 230 may be disposed on the same layer. In addition, the second oxide semiconductor layer 132 of the first active layer 130 and the second oxide semiconductor layer 232 of the second active layer 230 may be disposed on the same layer. Therefore, according to further still another embodiment of the present disclosure, the first active layer 130 and the second active layer 230 may be simultaneously made by the same process using the same material.

According to further still another embodiment of the present disclosure, the first oxide semiconductor layers 131 and 231 may have mobility higher than that of the second oxide semiconductor layers 132 and 232.

For example, the first oxide semiconductor layer 131 of the first active layer 130 and the first oxide semiconductor layer 231 of the second active layer 230 may be made of a high mobility oxide semiconductor material.

In detail, the first oxide semiconductor layer 131 of the first active layer 130 and the first oxide semiconductor layer 231 of the second active layer 230 may have mobility of 20 $cm^2/V \cdot s$ or more, respectively. In more detail, the first oxide semiconductor layer 131 of the first active layer 130 and the first oxide semiconductor layer 231 of the second active layer 230 may have mobility of 20 to 50 $cm^2/V \cdot s$, respectively, and may have mobility in the range of 20 to 40 $cm^2/V \cdot s$ or 20 to 30 $cm^2/V \cdot s$.

In the thin film transistor substrate 1000 of FIG. 10, the second oxide semiconductor layers 132 and 232 are disposed on the first oxide semiconductor layers 131 and 231. The first gate electrode 150 is disposed below the first active layer 130. As a result, in the first thin film transistor TFT1, the first gate electrode 150 may be disposed to be closer to the first oxide semiconductor layer 131 than the second oxide semiconductor layer 132.

Referring to FIG. 10, the first gate electrode 150 may be disposed on the base substrate 110, a second gate insulating layer 142 may be disposed on the first gate electrode 150, and the first active layer 130 may be disposed on the second gate insulating layer 142.

Referring to FIG. 10, the second gate electrode 250 is disposed on the second active layer 230. As a result, in the second thin film transistor TFT2, the second gate electrode 250 may be disposed to be closer to the second oxide semiconductor layer 232 than the first oxide semiconductor layer 231.

Referring to FIG. 10, the second active layer 230 may be disposed on the second gate insulating layer 142, a first gate insulating layer 141 may be disposed on the second active layer 230, and the second gate electrode 250 may be disposed on the first gate insulating layer 141.

According to further still another embodiment of the present disclosure, as shown in FIG. 10, the first gate electrode 150 and the second gate electrode 250 may be disposed to be opposite to each other with the first active layer 130 and the second active layer 230, which are interposed therebetween. In particular, the first gate electrode 150 may be disposed between the base substrate 110 and the first active layer 130.

Driving of the thin film transistor is mainly affected by a portion of the active layer, which is disposed to be close to the gate electrode.

According to further still another embodiment of the present disclosure, since the first gate electrode 150 of the first thin film transistor TFT1 is disposed to be close to the first oxide semiconductor layer 131, driving of the first thin film transistor TFT1 is mainly affected by the first oxide semiconductor layer 131. Since the first oxide semiconductor layer 131 has high mobility characteristics, the first thin film transistor TFT1 may have excellent current characteristics.

As the first thin film transistor TFT1 has excellent current characteristics, even though a width of the first active layer 130 is not great, a current may actively flow through the first thin film transistor TFT1. Therefore, a total area of the first thin film transistor TFT1 may be reduced, and a plurality of first thin film transistors TFT1 may be disposed to be integrated in a narrow area.

The first thin film transistor TFT1 having excellent mobility and current characteristics may be used as a switching transistor of a display device, and may be usefully used as a thin film transistor of a gate driver.

According to further still another embodiment of the present disclosure, since the second gate electrode 250 of the second thin film transistor TFT2 is disposed to be close to the second oxide semiconductor layer 232, driving of the second thin film transistor TFT2 is mainly affected by the second oxide semiconductor layer 232. Since the second oxide semiconductor layer 232 has excellent film stability and has low mobility, the second thin film transistor TFT2 may have excellent driving stability, and may have low current change characteristics.

Since the second oxide semiconductor layer 232 has relatively low mobility, the current amount is not great at a threshold voltage period of the second thin film transistor TFT2. Therefore, the second thin film transistor TFT2 may have a large s-factor. The second thin film transistor TFT2 having excellent driving stability and an excellent s-factor may be usefully used as a driving transistor or an emission control transistor of the display device.

Figure 11:
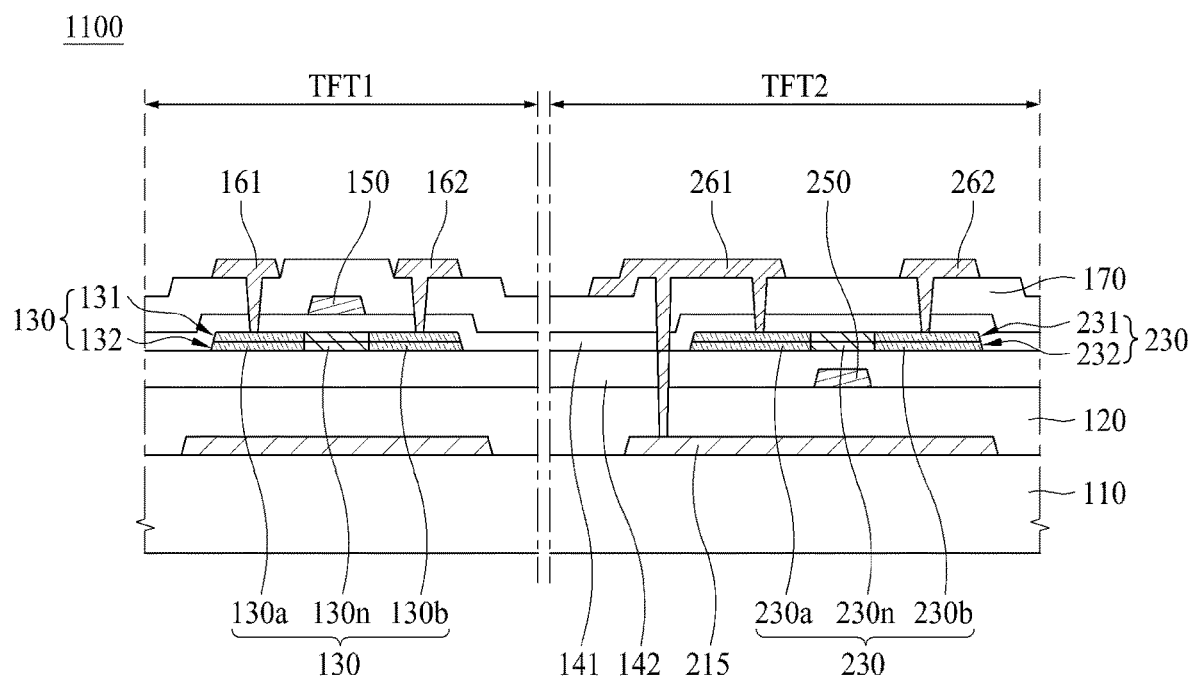
FIG. 11 is a cross-sectional view illustrating a thin film transistor substrate according to further still another embodiment of the present disclosure.

FIG. 11 is a cross-sectional view illustrating a thin film transistor substrate 1100 according to further still another embodiment of the present disclosure.

In the thin film transistor substrate 1100 of FIG. 11, the first oxide semiconductor layers 131 and 231 are disposed on the second oxide semiconductor layers 132 and 232.

Referring to FIG. 11, the first gate electrode 150 is disposed on the first active layer 130. As a result, in the first thin film transistor TFT1, the first gate electrode 150 may be disposed to be closer to the first oxide semiconductor layer 131 than the second oxide semiconductor layer 132.

Also, the second gate electrode 250 is disposed below the second active layer 230. As a result, in the second thin film transistor TFT2, the second gate electrode 250 may be disposed to be closer to the second oxide semiconductor layer 232 than the first oxide semiconductor layer 231.

Referring to FIG. 11, in order to form the second thin film transistor TFT2, the second gate electrode 250 may be disposed on the base substrate 110, the second gate insulating layer 142 may be disposed on the second gate electrode 250, and the second active layer 230 may be disposed on the second gate insulating layer 142.

Also, in order to form the first thin film transistor TFT1, the first active layer 130 may be disposed on the second gate insulating layer 142, the first gate insulating layer 141 may be disposed on the first active layer 130, and the first gate electrode 150 may be disposed on the first gate insulating layer 141.

As shown in FIG. 11, the first gate electrode 150 and the second gate electrode 250 may be disposed to be opposite to each other with the first active layer 130 and the second active layer 230, which are interposed therebetween. In particular, the second gate electrode 250 may be disposed between the base substrate 110 and the second active layer 230.

Hereinafter, a method of manufacturing a thin film transistor substrate 100 according to one embodiment of the present disclosure will be described with reference to FIGS. 12A to 12F.

FIGS. 12A to 12F are schematic views illustrating a method of manufacturing a thin film transistor substrate 100 according to one embodiment of the present disclosure.

Figure 12A:
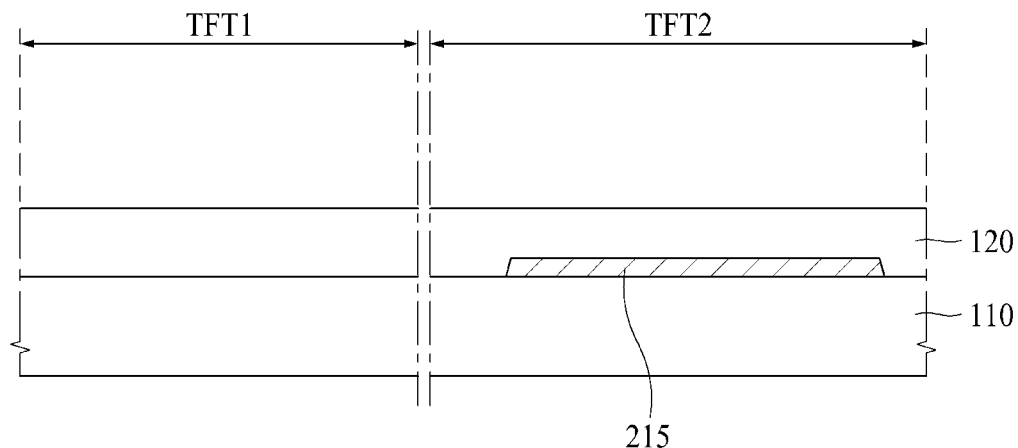
FIGS. 12A to 12F are schematic views illustrating a method of manufacturing a thin film transistor substrate according to one embodiment of the present disclosure.

Referring to FIG. 12A, the light shielding layer 215 may be formed on the base substrate 110, and the buffer layer 120 may be formed on the light shielding layer 215.

Figure 12B:
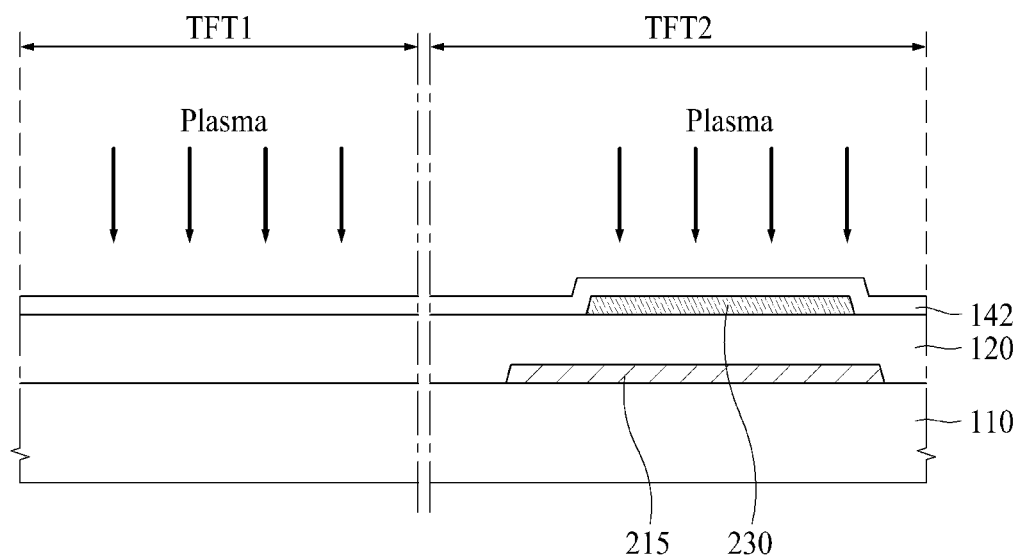

Referring to FIG. 12B, the second active layer 230 may be formed on the buffer layer 125, and the second gate insulating layer 142 may be formed on the second active layer 230.

According to one embodiment of the present disclosure, the second gate insulating layer 142 may be plasma-treated. $N_2O$ plasma may be applied as plasma. Oxygen may be supplied to the second gate insulating layer 142 by plasma treatment. Oxygen supplied by the plasma treatment may affect the second active layer 230, thereby improving stability of the second active layer 230 and increasing the s-factor of the second active layer 230.

In addition, the oxygen supplied to the second gate insulating layer 142 may improve stability of the first active layer 130 disposed on the second gate insulating layer 142.

In detail, the first active layer 130 may be made of an oxide semiconductor material having high mobility characteristics, and the oxide semiconductor material having high mobility characteristics may have an excessive oxygen vacancy. When the first active layer 130 has an excessive oxygen vacancy, stability of the first active layer 130 may be deteriorated, and the first active layer 130 may have electrical characteristics close to a conductor.

Therefore, the oxygen supplied to the second gate insulating layer 142 by the plasma treatment may affect stability improvement of the first active layer 130.

When a separate plasma treatment is performed for the first active layer 130, a plasma treatment for the second gate insulating layer 142 shown in FIG. 12B may be omitted.

Figure 12C:
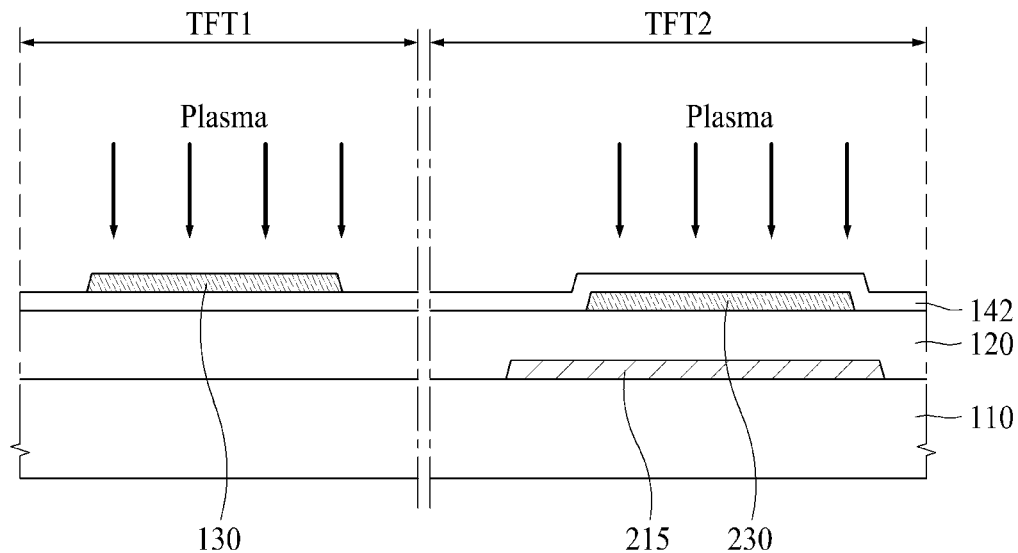

Referring to FIG. 12C, the first active layer 130 is formed on the second gate insulating layer 142. The first active layer 130 may be made of an oxide semiconductor material having high mobility characteristics.

According to one embodiment of the present disclosure, the first active layer 130 may be plasma-treated. $N_2O$ plasma may be applied as plasma. Oxygen may be supplied to the first active layer 130 by plasma treatment. The excessive oxygen vacancy of the first active layer 130 may be resolved by oxygen supply by plasma treatment. As a result, stability of the first active layer 130 may be improved.

As shown in FIG. 12B, when plasma treatment is performed for the second gate insulating layer 142, a separate plasma treatment for the first active layer 130 shown in FIG. 12C may be omitted. According to one embodiment of the present disclosure, only one of the plasma treatment shown in FIG. 12B and the plasma treatment shown in FIG. 12C may be performed, or both the plasma treatment shown in FIG. 12B and the plasma treatment shown in FIG. 12C may be performed.

Figure 12D:
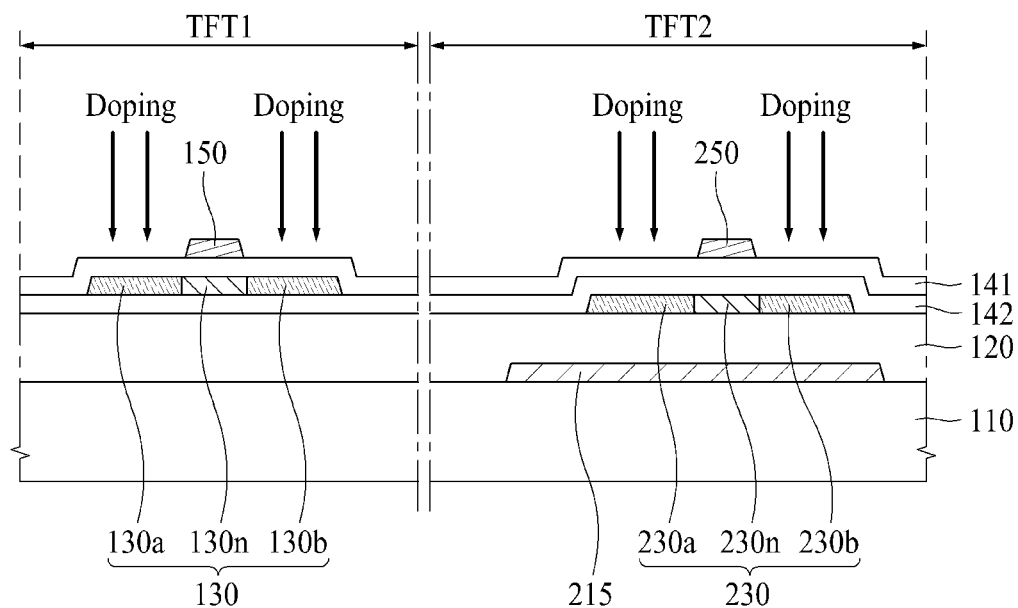

Referring to FIG. 12D, the first gate insulating layer 141 is formed on the first active layer 130, and the first gate electrode 150 and the second gate electrode 250 are formed on the first gate insulating layer 141. The first gate electrode 150 and the second gate electrode 250 may be made together by the same process using the same material. The first gate electrode 150 and the second gate electrode 250 may have the same thickness, but one embodiment of the present disclosure is not limited thereto, and the first gate electrode 150 and the second gate electrode 250 may be made of different materials or by different processes.

In addition, according to one embodiment of the present disclosure, the first active layer 130 and the second active layer 230 may be selectively conductorized by doping using the first gate electrode 150 and the second gate electrode 250 as masks. As a result, the first connection portion 130a and the second connection portion 130b of the first active layer 130 may be formed, and the first connection portion 230a and the second connection portion 230b of the second active layer 230 may be formed.

Although FIG. 12D shows the conductorization by doping, one embodiment of the present disclosure is not limited thereto. Conductorization may be performed by other methods known in the art. For example, conductorization may be performed by etching and plasma treatment of the gate insulating layers 141 and 142.

Figure 12E:
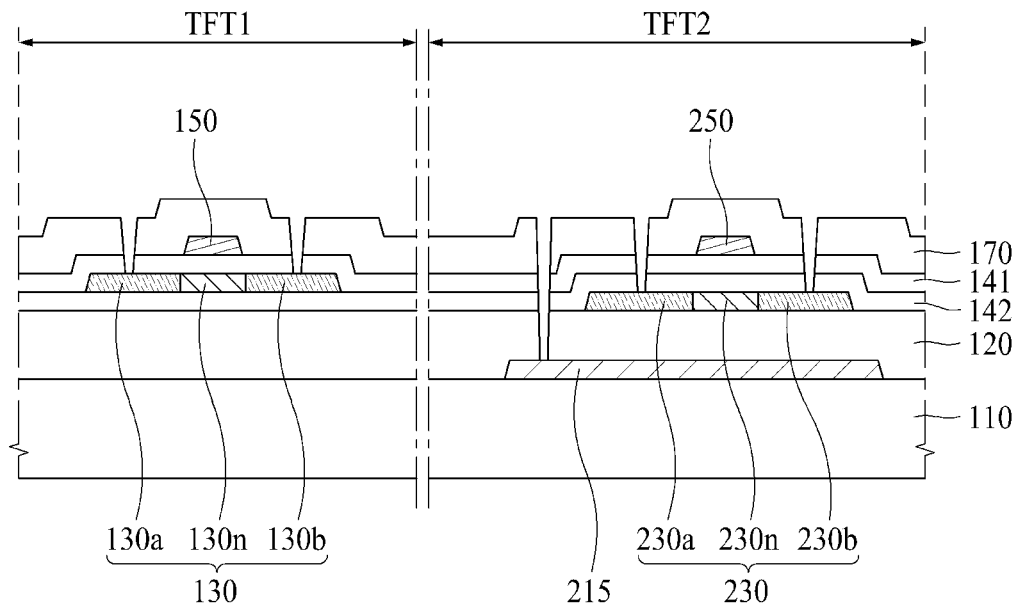

Referring to FIG. 12E, the interlayer insulating layer 170 is formed on the first gate electrode 150 and the second gate electrode 250. In addition, a contact hole passing through the interlayer insulating layer 170 and the gate insulating layers 141 and 142 may be formed.

Figure 12F:
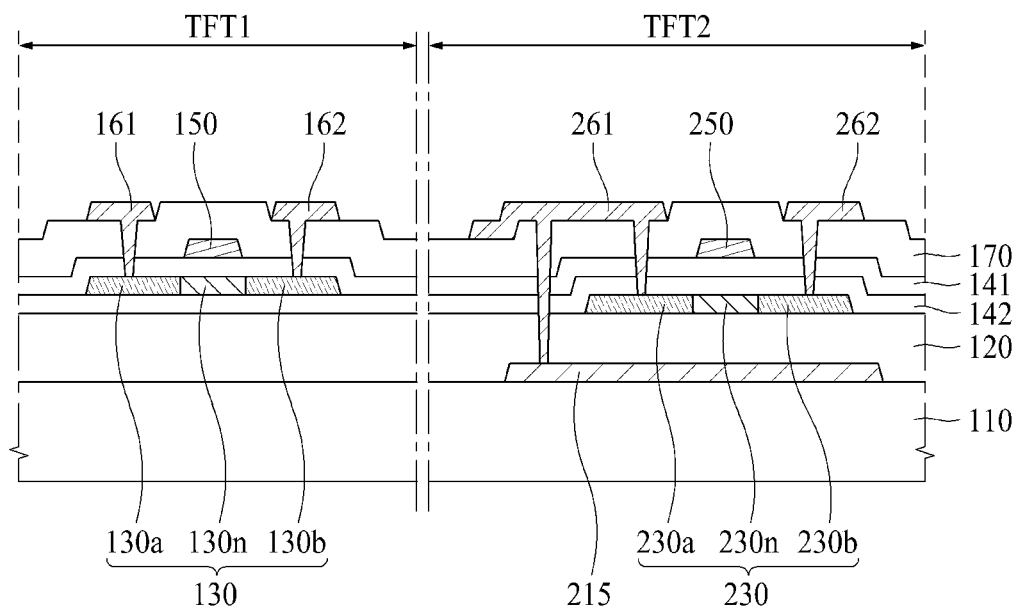

Referring to FIG. 12F, the source electrodes 161 and 261 and the drain electrodes 162 and 262 may be formed on the interlayer insulating layer 170. The source electrodes 161 and 261 and the drain electrodes 162 and 262 may be connected to the first and second active layers 130 and 230 through the contact hole. As a result, the thin film transistor 100 according to one embodiment of the present disclosure may be made.

Hereinafter, the display device to which the above-described thin film transistor substrates 100, 200, 300, 400, 500, 600, 700, 800, 900, 1000 and 1100 are applied will be described in detail.

Figure 13:
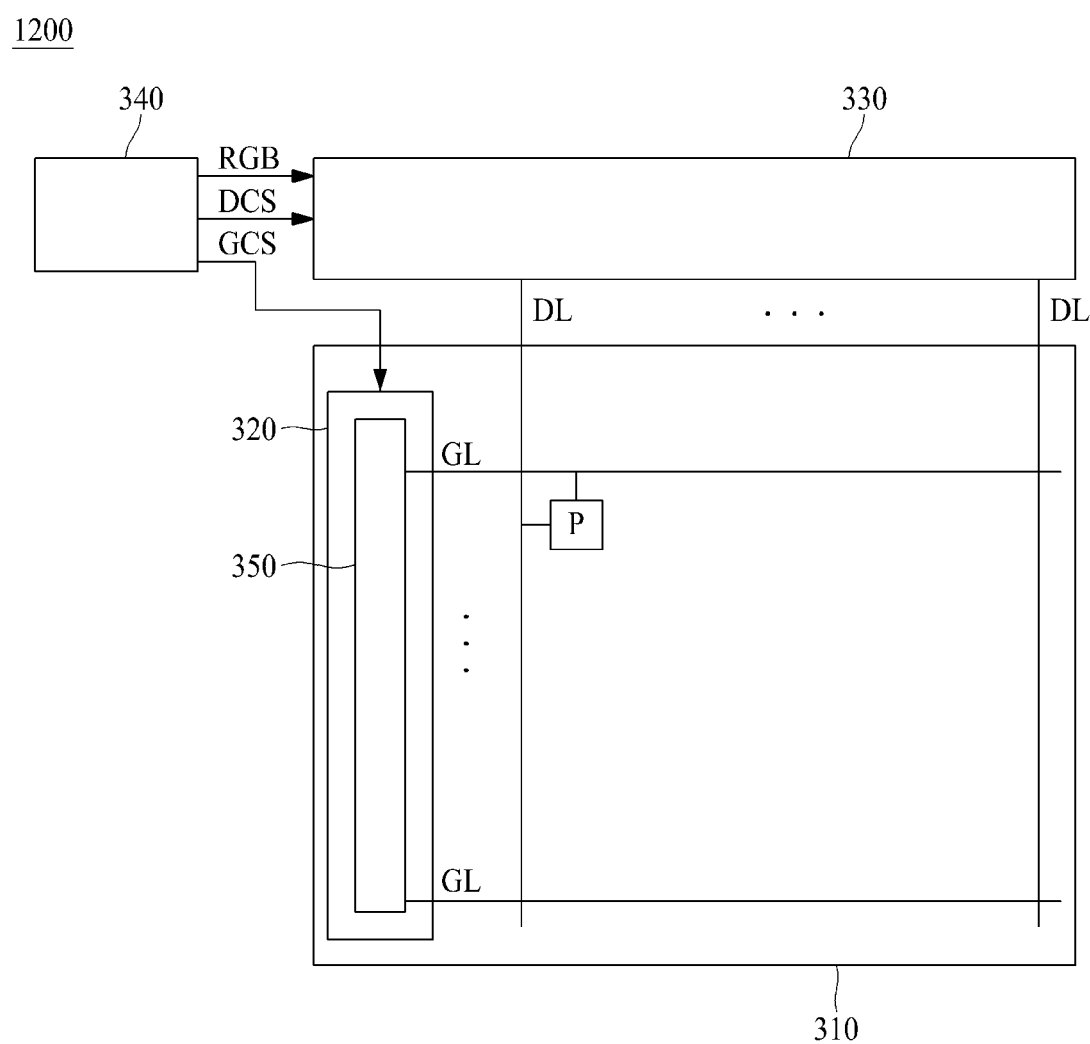
FIG. 13 is a schematic view illustrating a display device according to another embodiment of the present disclosure.

FIG. 13 is a schematic view illustrating a display device 1200 according to another embodiment of the present disclosure.

As shown in FIG. 13, the display device 1200 according to another embodiment of the present disclosure may include a display panel 310, a gate driver 320, a data driver 330, and a controller 340.

The display panel 310 includes gate lines GL and data lines DL, and pixels P are disposed in intersection areas of the gate lines GL and the data lines DL. An image is displayed by driving of the pixel P. The gate lines GL, the data lines DL, and the pixel P may be disposed on the base substrate 110.

The controller 340 controls the gate driver 320 and the data driver 330.

The controller 340 outputs a gate control signal GCS for controlling the gate driver 320 and a data control signal DCS for controlling the data driver 330 by using signals supplied from an external system (not shown). Also, the controller 340 samples input image data input from the external system, realigns the sampled data and supplies the realigned digital image data RGB to the data driver 330.

The gate control signal GCS includes a gate start pulse GSP, a gate shift clock GSC, a gate output enable signal GOE, a start signal Vst, and a gate clock GCLK. Also, control signals for controlling a shift register may be included in the gate control signal GCS.

The data control signal DCS includes a source start pulse SSP, a source shift clock signal SSC, a source output enable signal SOE, and a polarity control signal POL.

The data driver 330 supplies a data voltage to the data lines DL of the display panel 310. In detail, the data driver 330 converts the image data RGB input from the controller 340 to an analog data voltage and supplies the data voltage to the data lines DL.

According to one embodiment of the present disclosure, the gate driver 320 may be packaged in the display panel 310. In this way, a structure in which the gate driver 320 is directly packaged in the display panel 310 will be referred to as a Gate In Panel (GIP) structure.

In detail, the gate driver 320 may be disposed on the base substrate 110 in the Gate In Panel (GIP) structure. According to one embodiment of the present disclosure, the gate driver 320 may include at least one of the first thin film transistor TFT1 or the second thin film transistor TFT2 of the above-described thin film transistor substrates 100, 200, 300, 400, 500, 600, 700, 800, 900, 1000 and 1100. For example, the first thin film transistor TFT1 may be applied to the gate driver 320 in a gate-in-panel (GIP) structure, the second thin film transistor TFT2 may be applied to the gate driver 320 in a gate-in-panel (GIP) structure, or both the first thin film transistor TFT1 and the second thin film transistor TFT2 may be applied.

The gate driver 320 may include a shift register 350.

The shift register 350 sequentially supplies gate pulses to the gate lines GL for one frame by using the start signal and the gate clock, which are transmitted from the controller 340. In this case, one frame means a period at which one image is output through the display panel 310. The gate pulse has a turn-on voltage for turning on a switching element (thin film transistor) disposed in the pixel P.

Also, the shift register 350 supplies a gate-off signal capable of turning off a switching element, to the gate line GL for the other period of one frame, at which the gate pulse is not supplied. Hereinafter, the gate pulse and the gate-off signal will be collectively referred to as a scan signal SS or Scan.

The shift register 350 may include at least one of the first thin film transistor TFT1 or the second thin film transistor TFT2 of the above-described thin film transistor substrates 100, 200, 300, 400, 500, 600, 700, 800, 900, 1000 and 1100.

Figure 14:
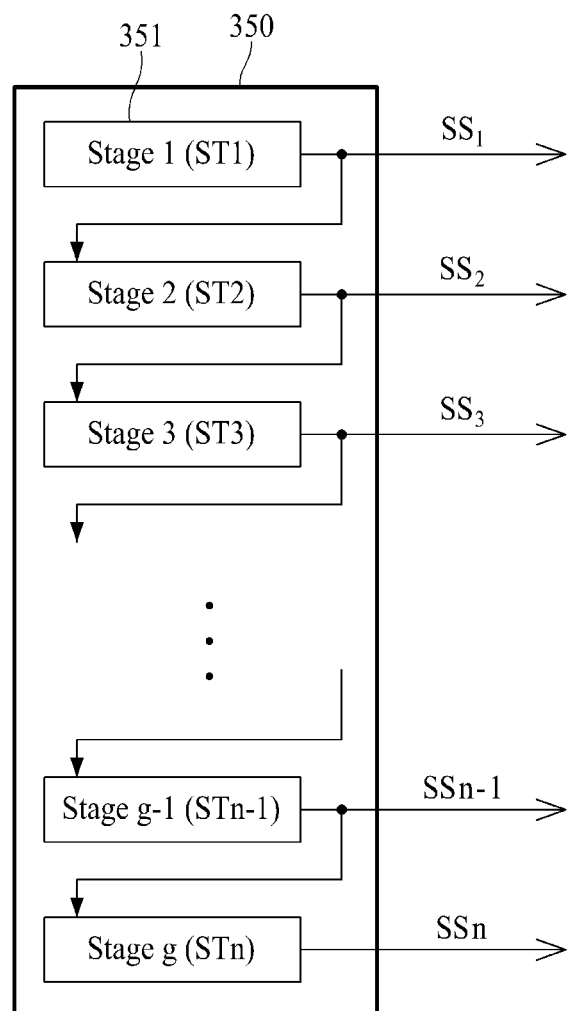
FIG. 14 is a schematic view illustrating a shift register according to one embodiment.
Figure 15:
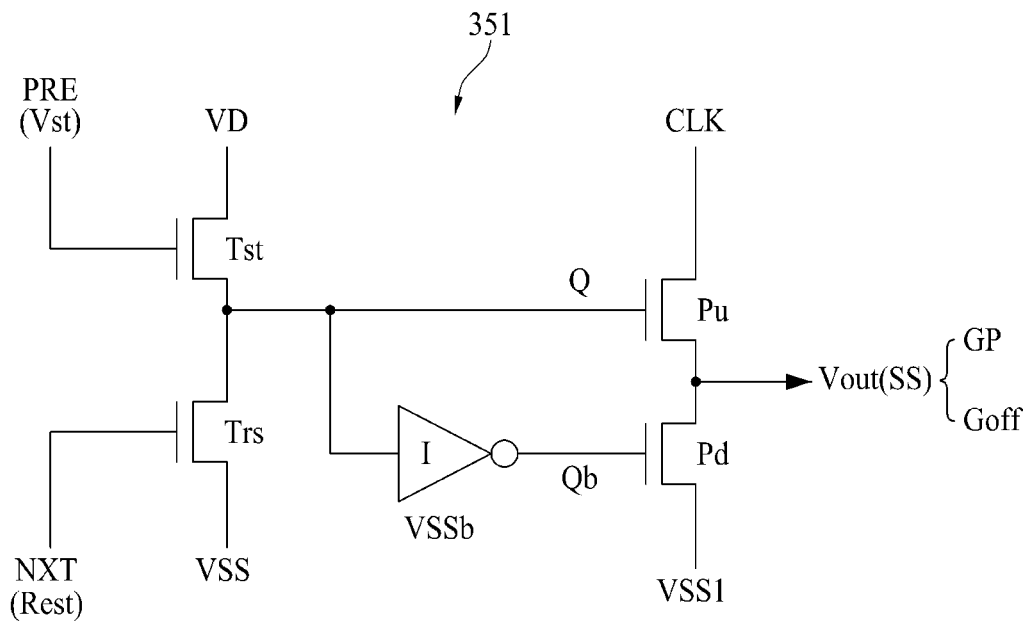
FIG. 15 is a circuit view illustrating a stage provided in the shift register of FIG. 14 according to one embodiment.

FIG. 14 is a schematic view illustrating a shift register 350. FIG. 15 is a circuit view illustrating a stage 451 provided in the shift register 350 of FIG. 14.

Referring to FIG. 14, the shift register 350 may include n stages 351 ST1 to STn.

The shift register 350 transmits one scan signal SS to pixels P connected to one gate line GL through one gate line GL. Each of the stages 351 may be connected to one gate line GL. When n gate lines GL are formed in the display panel 110, the shift register 350 may include n stages 351 ST1 to STn, and may generate n scan signals SS1 to SSn.

In general, each stage 351 outputs the gate pulse GP once during one frame, and the gate pulses GP are sequentially output from each stage 351.

Each of the stages 351 for sequentially outputting the gate pulses GP may include a pull-up transistor Pu, a pull-down transistor Pd, a start transistor Tst, a reset transistor Trs, and an inverter I, as shown in FIG. 15. The above-described first thin film transistor TFT1 may be applied to the pull-up transistor Pu, the pull-down transistor Pd, the start transistor Tst, and the reset transistor Trs. In addition, according to one embodiment of the present disclosure, the first thin film transistor TFT1 may be applied to a portion of the pull-up transistor Pu, the pull-down transistor Pd, the start transistor Tst, and the reset transistor Trs, and the second thin film transistor TFT2 may be applied to the other portion of the pull-up transistor Pu, the pull-down transistor Pd, the start transistor Tst, and the reset transistor Trs.

The pull-up transistor Pu is turned on or off in accordance with a logic state of a Q node, and is supplied with the clock signal CLK to output the gate pulse GP [Vout(SS)] when it is turned on.

The pull-down transistor Pd is connected between the pull-up transistor Pu and a turn-off voltage VSS1, and is turned off when the pull-up transistor Pu is turned on, and is turned on to output the gate-off signal Goff when the pull-up transistor Pu is turned off.

As described above, the output Vout of the stage 351 includes the gate pulse GP and the gate-off signal Goff. The gate pulse GP has a voltage of high level, and the gate-off signal Goff has a voltage of low level.

The start transistor Tst charges the Q node with a high level voltage VD in response to a pre-stage output PRE from the previous stage. When the corresponding stage 351 is the first stage ST1, the start pulse Vst is supplied instead of the pre-stage output PRE.

The reset transistor Trs discharges the Q node with a low potential voltage VSS, which is a reset voltage, in response to a rear-stage output NXT from next stage. When the stage 351 is the last stage STg, the reset pulse Rest is supplied instead of the rear-stage output NXT.

The control signal input to a gate terminal of the reset transistor Trs generally maintains a low state when the Q node is high.

When a signal of high level is input to the Q node, the pull-up transistor Pu is turned on to output the gate pulse GP. At this time, the reset transistor Trs should be turned off, so that the low potential voltage VSS is not supplied to the reset transistor Trs.

When the gate pulse GP is output, a control signal of high level is input to the gate terminal of the reset transistor Trs, so that the reset transistor Trs is turned on, and the pull-up transistor Pu is turned off. As a result, the gate pulse GP is not output through the pull-up transistor Pu.

When the gate pulse GP is not generated, the inverter I serves to transmit a Qb node control signal for generating the gate-off signal Goff to the pull-down transistor Pd through the Qb node.

By a turn-on voltage capable of turning on the switching element of each pixel P connected to the gate line GL, the data voltage is output to the data lines DL every one horizontal period, and the gate-off signal Goff for maintaining the switching element at a turn-off state should be output to the gate line GL during the other period except for one horizontal period of one frame.

To this end, the inverter I transmits the Qb node control signal to the pull-down transistor Pd through the Qb node during the other period except for one horizontal period of one frame.

The pull-down transistor Pd is turned on by the Qb node control signal supplied from the inverter I, so that the gate-off signal Goff is output to the gate line GL.

Figure 16:
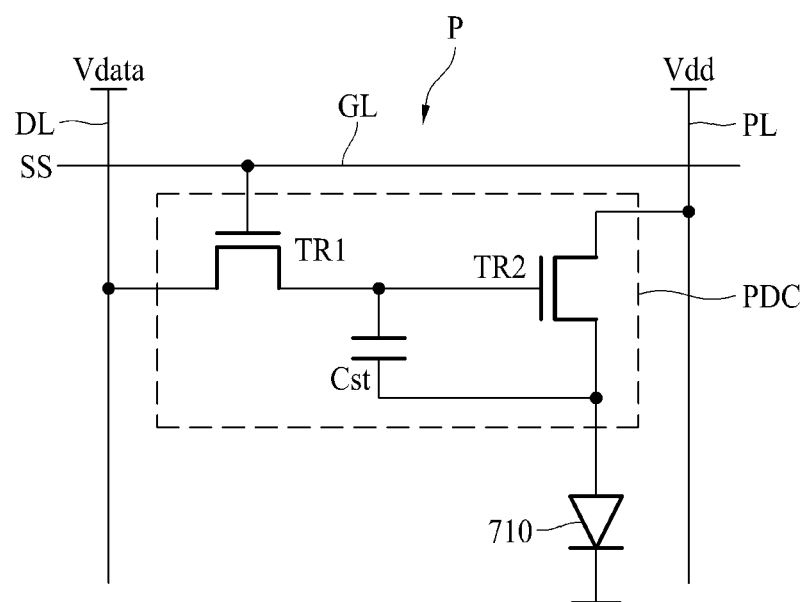
FIG. 16 is a circuit view of any one pixel in FIG. 13 according to one embodiment.
Figure 17:
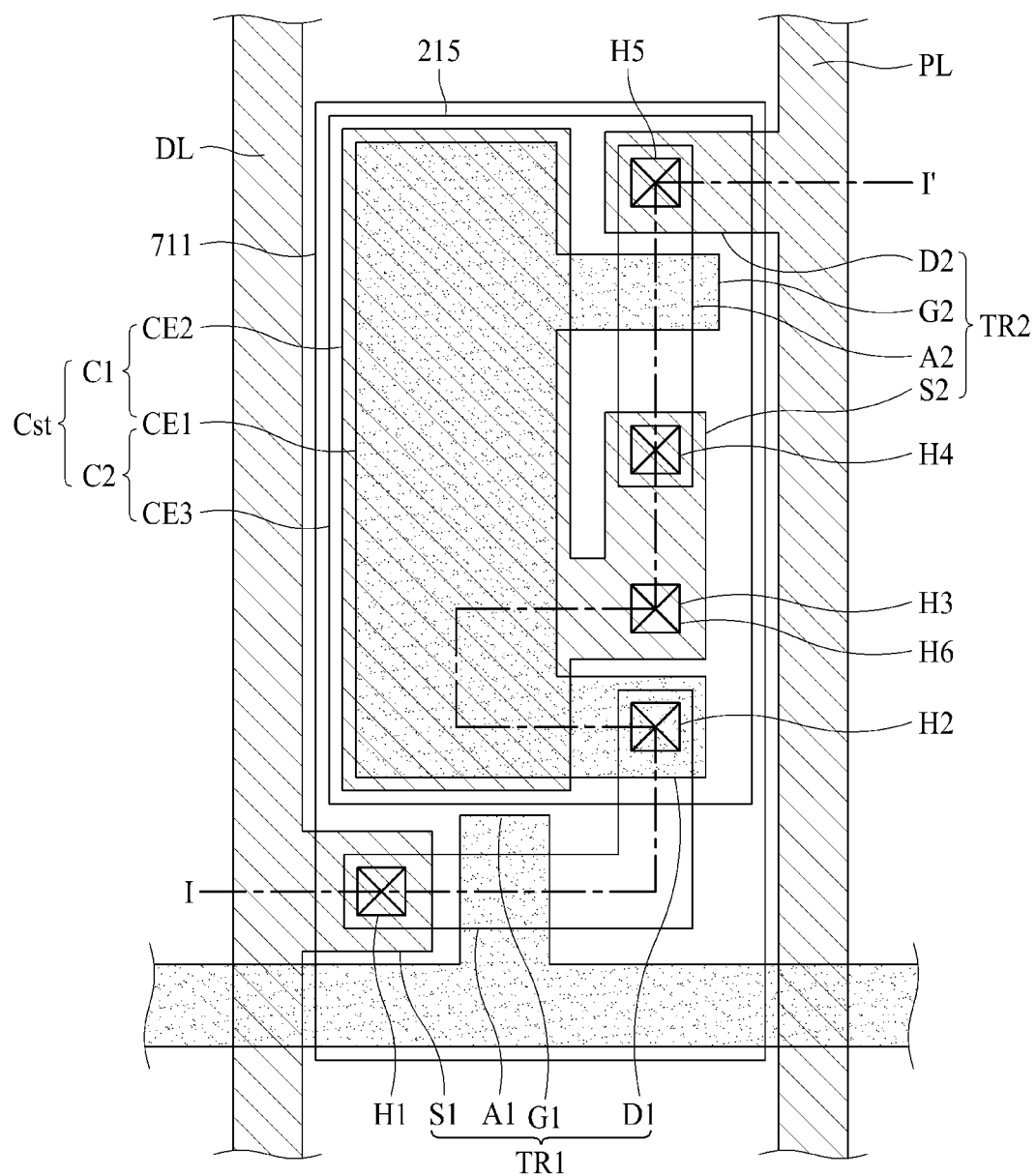
FIG. 17 is a plan view illustrating a pixel of FIG. 16 according to one embodiment.
Figure 18:
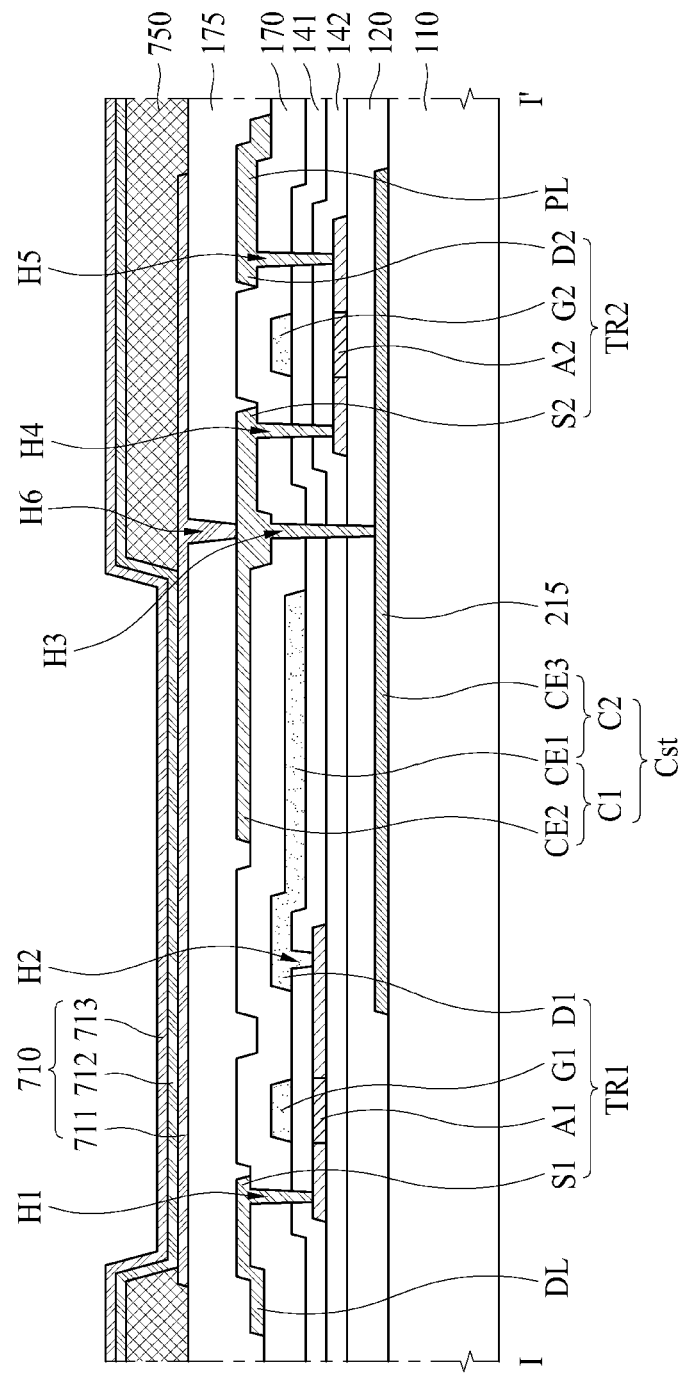
FIG. 18 is a cross-sectional view taken along line I-I' of FIG. 17 according to one embodiment.

FIG. 16 is a circuit view of any one pixel P in FIG. 13 according to one embodiment, FIG. 17 is a plan view illustrating a pixel P of FIG. 16 according to one embodiment, and FIG. 18 is a cross-sectional view taken along line I-I' of FIG. 17 according to one embodiment.

The circuit view of FIG. 16 is an equivalent circuit view for the pixel P of the display device 1200 that includes the organic light emitting diode (OLED) as the display element 710.

The pixel P includes a display element 710 and a pixel driving circuit PDC for driving the display element 710.

The pixel driving circuit PDC may include the first thin film transistor TFT1 and second thin film transistor TFT2 of the above-described thin film transistor substrates 100, 200, 300, 400, 500, 600, 700, 800, 900, 1000 and 1100.

The pixel driving circuit PDC of FIG. 16 includes a first thin film transistor TR1 that is a switching transistor, and a second thin film transistor TR2 that is a driving transistor.

The first thin film transistor TFT1 of the above-described thin film transistor substrates 100, 200, 300, 400, 500, 600, 700, 800, 900, 1000 and 1100 may be applied to the first thin film transistor TR1 that is a switching transistor.

The second thin film transistor TFT2 of the above-described thin film transistor substrates 100, 200, 300, 400, 500, 600, 700, 800, 900, 1000 and 1100 may be applied to the second thin film transistor TR2 that is a driving transistor.

The first thin film transistor TR1 is connected to the gate line GL and the data line DL, and is turned on or off by the scan signal SS supplied through the gate line GL.

The data line DL provides a data voltage Vdata to the pixel driving circuit PDC, and the first thin film transistor TR1 controls applying of the data voltage Vdata.

A driving power line PL provides a driving voltage Vdd to the display element 710, and the first thin film transistor TR1 controls the driving voltage Vdd. The driving voltage Vdd is a pixel driving voltage for driving the organic light emitting diode (OLED) that is the display element 710.

When the second thin film transistor TR2 is turned on by the scan signal SS applied from the gate driver 320 through the gate line GL, the data voltage Vdata supplied through the data line DL is supplied to a gate electrode G2 of the second thin film transistor TR2 connected with the display element 710. The data voltage Vdata is charged in a storage capacitor Cst formed between the gate electrode G2 and a source electrode S2 of the second thin film transistor TR2.

The amount of a current supplied to the organic light emitting diode (OLED) that is the display element 710 through the second thin film transistor TR2 is controlled in accordance with the data voltage Vdata, whereby a gray scale of light emitted from the display element 710 may be controlled.

Referring to FIGS. 17 and 18, the first thin film transistor TR1 and the second thin film transistor TR2 are disposed on the base substrate 110.

The base substrate 110 may be made of glass or plastic. Plastic having a flexible property, for example, polyimide (PI), may be used as the base substrate 110.

Referring to FIG. 18, a light shielding layer 215 is disposed on the base substrate 110.

The light shielding layer 215 may have light shielding characteristics. The light shielding layer 215 may shield light incident from the outside to protect active layers A1 and A2.

A buffer layer 120 is disposed on the light shielding layer 215. The buffer layer 120 is made of an insulating material, and protects the active layers A1 and A2 from external water or oxygen.

The second active layer A2 of the second thin film transistor TR2 is disposed on the buffer layer 120. The second active layer A2 may include, for example, a low mobility oxide semiconductor material.

A second gate insulating layer 142 is disposed on the second active layer A2. The second gate insulating layer 142 may cover the entire upper surface of the second active layer A2.

The first active layer A1 of the first thin film transistor TR1 is disposed on the second gate insulating layer 142. The first active layer A1 may include, for example, a high mobility oxide semiconductor material.

Referring to FIGS. 17 and 18, the first gate electrode G1 of the first thin film transistor TR1 and the second gate electrode G2 of the second thin film transistor TR2 are disposed on the first gate insulating layer 141. In addition, a drain electrode D1 of the first thin film transistor TR1 may be disposed on the first gate insulating layer 141.

A gate line GL is disposed on the first gate insulating layer 141. A portion of the gate line GL may be the first gate electrode G1 of the first thin film transistor TR1.

The drain electrode D1 of the first thin film transistor TR1 may be connected to the first active layer A1 through a second contact hole H2.

The drain electrode D1 of the first thin film transistor TR1 may be extended onto the first gate insulating layer 141 to form a first capacitor electrode CE1. In addition, a portion of the first capacitor electrode CE1 may be extended to an upper portion of the second active layer A2, and thus may be the second gate electrode G2 of the second thin film transistor TR2.

According to another embodiment of the present disclosure, the drain electrode D1 of the first thin film transistor TR1, the first capacitor electrode CE1, and the second gate electrode G2 of the second thin film transistor TR2 may be integrally formed.

An interlayer insulating layer 170 is disposed on the gate line GL, the first gate electrode G1, the second gate electrode G2, the drain electrode D1 of the first thin film transistor TR1 and the first capacitor electrode CE1.

A data line DL, a driving power line PL, a source electrode S1 of the first thin film transistor TR1, and a source electrode S2 and a drain electrode D2 of the second thin film transistor TR2 are disposed on the interlayer insulating layer 170.

The source electrode S1 of the first thin film transistor TR1 may be integrally formed with the data line DL. The source electrode S1 of the first thin film transistor TR1 may be connected to the first active layer A1 through a first contact hole H1.

The drain electrode D2 of the second thin film transistor TR2 may be integrally formed with the driving power line PL. The drain electrode D2 of the second thin film transistor TR2 may be connected to the second active layer A2 through a fifth contact hole H5.

The source electrode S2 of the second thin film transistor TR2 may be connected to the second active layer A2 through a fourth contact hole H4.

The source electrode S2 of the second thin film transistor TR2 may be extended to the interlayer insulating layer 170 to form a second capacitor electrode CE2.

The source electrode S2 of the second thin film transistor TR2 may be connected to the light shielding layer 215 through a third contact hole H3. As a result, the same voltage as that of the source electrode S2 of the second thin film transistor TR2 may be applied to the light shielding layer 215, and the light shielding layer 215 may serve as a third capacitor electrode CE3.

A first capacitor C1 may be formed by the first capacitor electrode CE1 and the second capacitor electrode CE2. A second capacitor C2 may be formed by the first capacitor electrode CE1 and the third capacitor electrode CE3. As a result, a storage capacitor Cst may be formed by the first capacitor C1 and the second capacitor C2.

A planarization layer 175 is disposed on the data line DL, the driving power line PL, the second capacitor electrode CE2, the source electrode S1 of the first thin film transistor TR1, and the source electrode S2 and the drain electrode D2 of the second thin film transistor TR2. The planarization layer 175 planarizes upper portions of the first thin film transistor TR1 and the second thin film transistor TR2, and protects the first thin film transistor TR1 and the second thin film transistor TR2.

A first electrode 711 of the display element 710 is disposed on the planarization layer 175. The first electrode 711 of the display element 710 may be connected to the second capacitor electrode CE2 through a sixth contact hole H6 formed in the planarization layer 175. As a result, the first electrode 711 of the display element 710 may be connected to the source electrode S2 of the second thin film transistor TR2.

A bank layer 750 is disposed at an edge of the first electrode 711 of the display element 710. The bank layer 750 defines a light emission area of the display element 710.

An organic light emitting layer 712 is disposed on the first electrode 711, and a second electrode 713 is disposed on the organic light emitting layer 712. Therefore, the display element 710 is completed. The display element 710 shown in FIG. 12 is an organic light emitting diode (OLED). Therefore, the display device 1200 according to one embodiment of the present disclosure is an organic light emitting display device.

Figure 19:
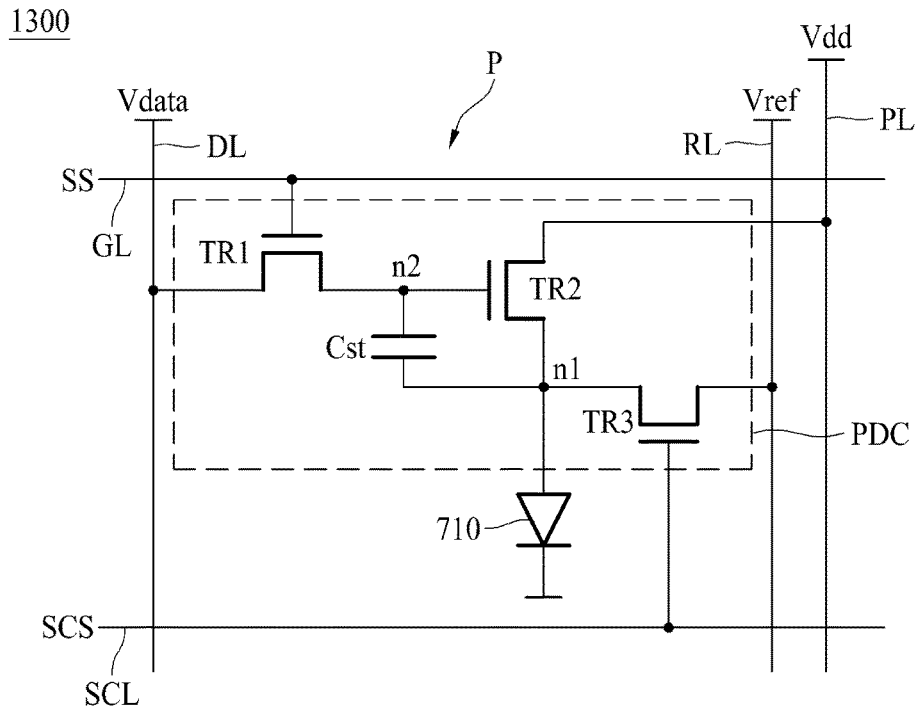
FIG. 19 is a circuit view illustrating any one pixel of a display device according to still another embodiment of the present disclosure.

FIG. 19 is a circuit view illustrating any one pixel P of a display device 1300 according to still another embodiment of the present disclosure.

FIG. 19 is an equivalent circuit view for a pixel P of an organic light emitting display device.

The pixel P of the display device 1300 shown in FIG. 19 includes an organic light emitting diode (OLED) that is a display element 710 and a pixel driving circuit PDC for driving the display element 710. The display element 710 is connected to the pixel driving circuit PDC.

In the pixel P, signal lines DL, GL, PL, RL and SCL for supplying a signal to the pixel driving circuit PDC are disposed.

The data voltage Vdata is supplied to the data line DL, the scan signal SS is supplied to the gate line GL, the driving voltage Vdd for driving the pixel is supplied to the driving power line PL, a reference voltage Vref is supplied to the reference line RL, and a sensing control signal SCS is supplied to the sensing control line SCL.

The pixel driving circuit PDC includes, for example, a first thin film transistor TR1 (switching transistor) connected with the gate line GL and the data line DL, a second thin film transistor TR2 (driving transistor) for controlling a magnitude of a current output to the display element 710 in accordance with the data voltage Vdata transmitted through the first thin film transistor TR1, and a third thin film transistor TR3 (sensing transistor) for sensing characteristics of the second thin film transistor TR2.

The storage capacitor Cst is positioned between the gate electrode of the second thin film transistor TR2 and the display element 710.

The first thin film transistor TR1 is turned on by the scan signal SS supplied to the gate line GL to transmit the data voltage Vdata, which is supplied to the data line DL, to the gate electrode of the second thin film transistor TR2.

The third thin film transistor TR3 is connected to a first node n1 between the second thin film transistor TR2 and the display element 710 and the reference line RL, and thus is turned on or off by the sensing control signal SCS and senses characteristics of the second thin film transistor TR2, which is a driving transistor, for a sensing period. Any one of the first thin film transistor TFT1 and the second thin film transistor TFT2 of the above-described thin film transistor substrates 100, 200, 300, 400, 500, 600, 700, 800, 900, 1000 and 1100 may be applied to the third thin film transistor TR3.

A second node n2 connected with the gate electrode of the second thin film transistor TR2 is connected with the first thin film transistor TR1. The storage capacitor Cst is formed between the second node n2 and the first node n1.

When the first thin film transistor TR1 is turned on, the data voltage Vdata supplied through the data line DL is supplied to the gate electrode of the second thin film transistor TR2. The data voltage Vdata is charged in the storage capacitor Cst formed between the gate electrode and the source electrode of the second thin film transistor TR2.

When the second thin film transistor TR2 is turned on, the current is supplied to the display element 710 through the second thin film transistor TR2 in accordance with the driving voltage Vdd for driving the pixel, whereby light is output from the display element 710.

Figure 20:
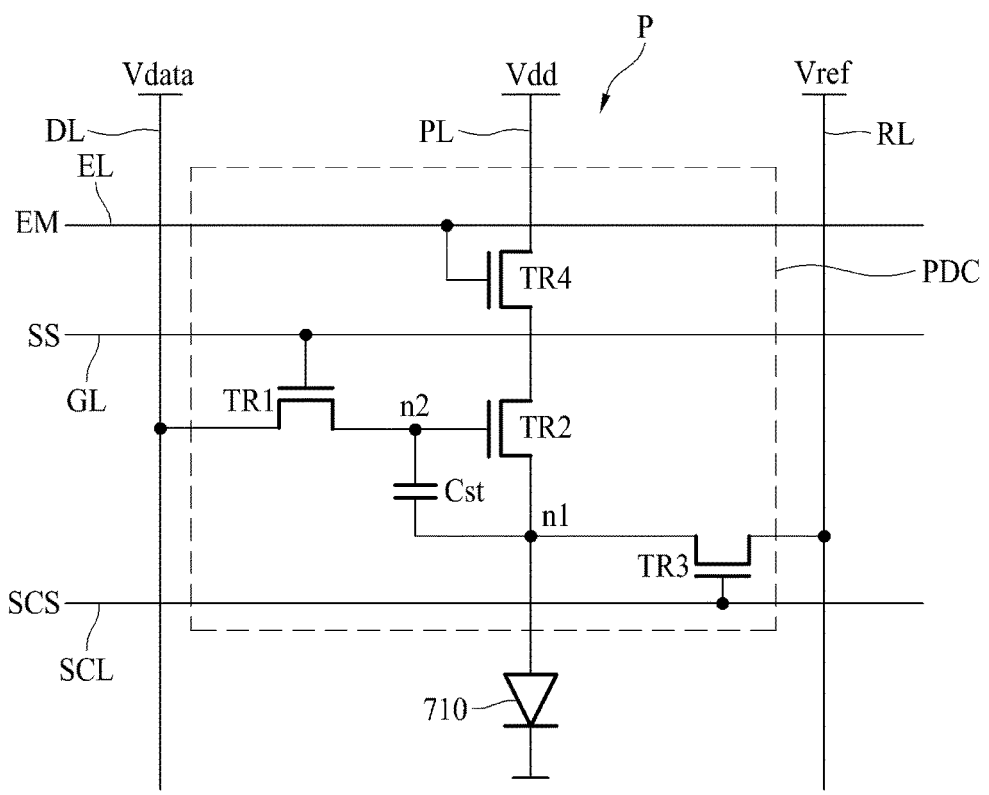
FIG. 20 is a circuit view illustrating any one pixel of a display device according to further still another embodiment of the present disclosure.
Figure 21:
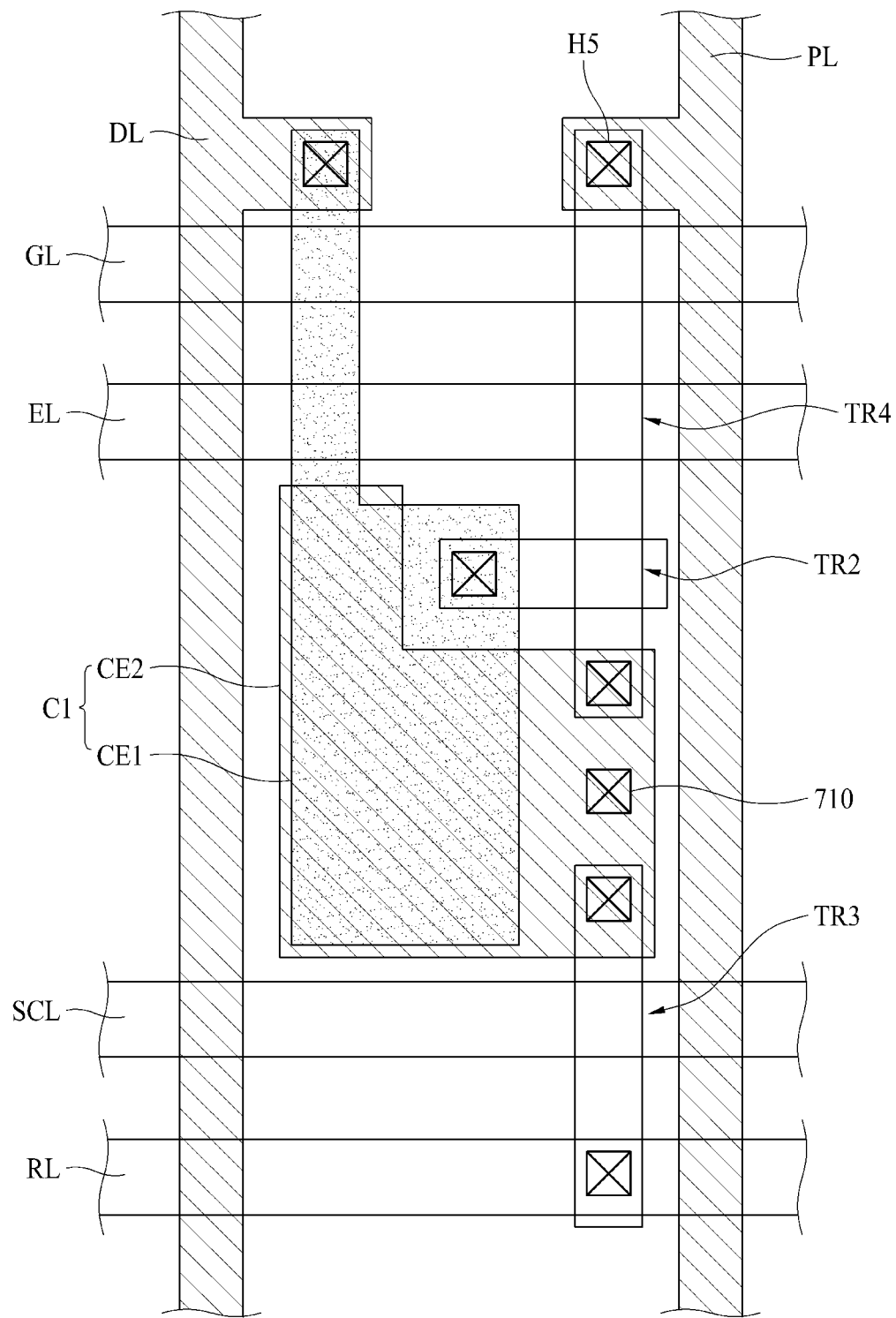
FIG. 21 is a plan view illustrating the pixel of FIG. 20 according to one embodiment.

FIG. 20 is a circuit view illustrating any one pixel P of a display device 1400 according to further still another embodiment of the present disclosure. FIG. 21 is a plan view illustrating the pixel of FIG. 20. The pixel shown in FIG. 20 may be displayed in a plan view as shown in FIG. 21.

The pixel P of the display device 1400 shown in FIG. 20 includes an organic light emitting diode (OLED) that is a display element 710 and a pixel driving circuit PDC for driving the display element 710. The display element 710 is connected with the pixel driving circuit PDC.

The pixel driving circuit PDC includes thin film transistors TR1, TR2, TR3 and TR4.

In the pixel P, signal lines DL, EL, GL, PL, SCL and RL for supplying a driving signal to the pixel driving circuit PDC are disposed.

In comparison with the pixel P of FIG. 19, the pixel P of FIG. 20 further includes an emission control line EL. An emission control signal EM is supplied to the emission control line EL.

Also, the pixel driving circuit PDC of FIG. 20 further includes a fourth thin film transistor TR4 that is an emission control transistor for controlling a light emission timing of the second thin film transistor TR2, in comparison with the pixel driving circuit PDC of FIG. 19.

The first thin film transistor TR1 is turned on by the scan signal SS supplied to the gate line GL to transmit the data voltage Vdata, which is supplied to the data line DL, to the gate electrode of the second thin film transistor TR2.

A storage capacitor Cst is positioned between the gate electrode of the second thin film transistor TR2 and the display element 710.

The third thin film transistor TR3 is connected to the reference line RL, and thus is turned on or off by the sensing control signal SCS and senses characteristics of the second thin film transistor TR2, which is a driving transistor, for a sensing period.

The fourth thin film transistor TR4 transfers the driving voltage Vdd to the second thin film transistor TR2 in accordance with the emission control signal EM or shields the driving voltage Vdd. When the fourth thin film transistor is turned on, a current is supplied to the second thin film transistor TR2, whereby light is output from the display element 710.

According to further still another embodiment of the present disclosure, the second thin film transistor TFT2 of the above-described thin film transistor substrates 100, 200, 300, 400, 500, 600, 700, 800, 900, 1000 and 1100 may be used as the fourth thin film transistor TR4 that is an emission control transistor.

In addition, the second thin film transistor TFT2 of the above-described thin film transistor substrates 100, 200, 300, 400, 500, 600, 700, 800, 900, 1000 and 1100 may be used as the second thin film transistor TR2 that is a driving transistor.

The first thin film transistor TFT1 of the above-described thin film transistor substrates 100, 200, 300, 400, 500, 600, 700, 800, 900, 1000 and 1100 may be used as the first thin film transistor TR1 that is a switching transistor.

The pixel driving circuit PDC according to further still another embodiment of the present disclosure may be formed in various structures in addition to the above-described structure. The pixel driving circuit PDC may include, for example, five or more thin film transistors.

Figure 22:
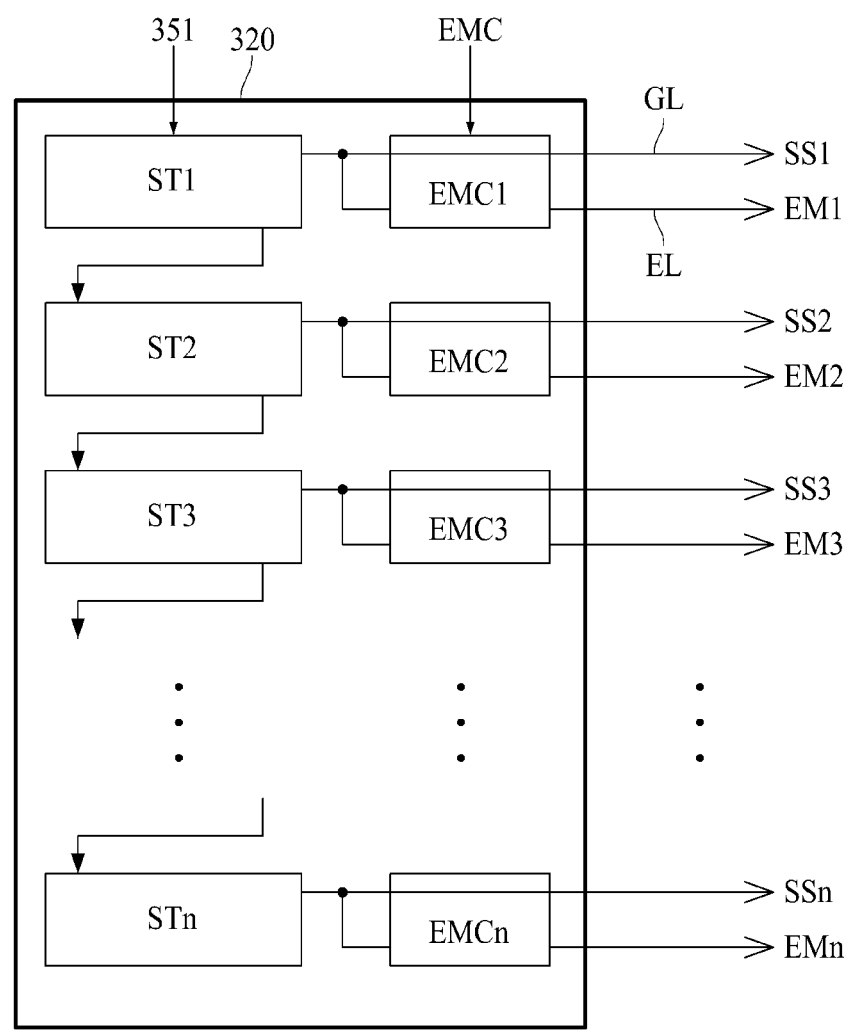
FIG. 22 is a schematic view illustrating a gate driver according to another embodiment of the present disclosure.

FIG. 22 is a schematic view illustrating a gate driver 320 according to another embodiment of the present disclosure.

In detail, as shown in FIGS. 20 and 21, the display device 1400, which includes the fourth thin film transistor TR4 that is an emission control transistor, may have the gate driver 320 shown in FIG. 22.

Referring to FIG. 22, the gate driver 320 may include n number of stages ST1 to STn, and n emission control circuits EMC1 to EMCn, which are dependently connected to the n stages ST1 to STn, respectively.

Figure 23:
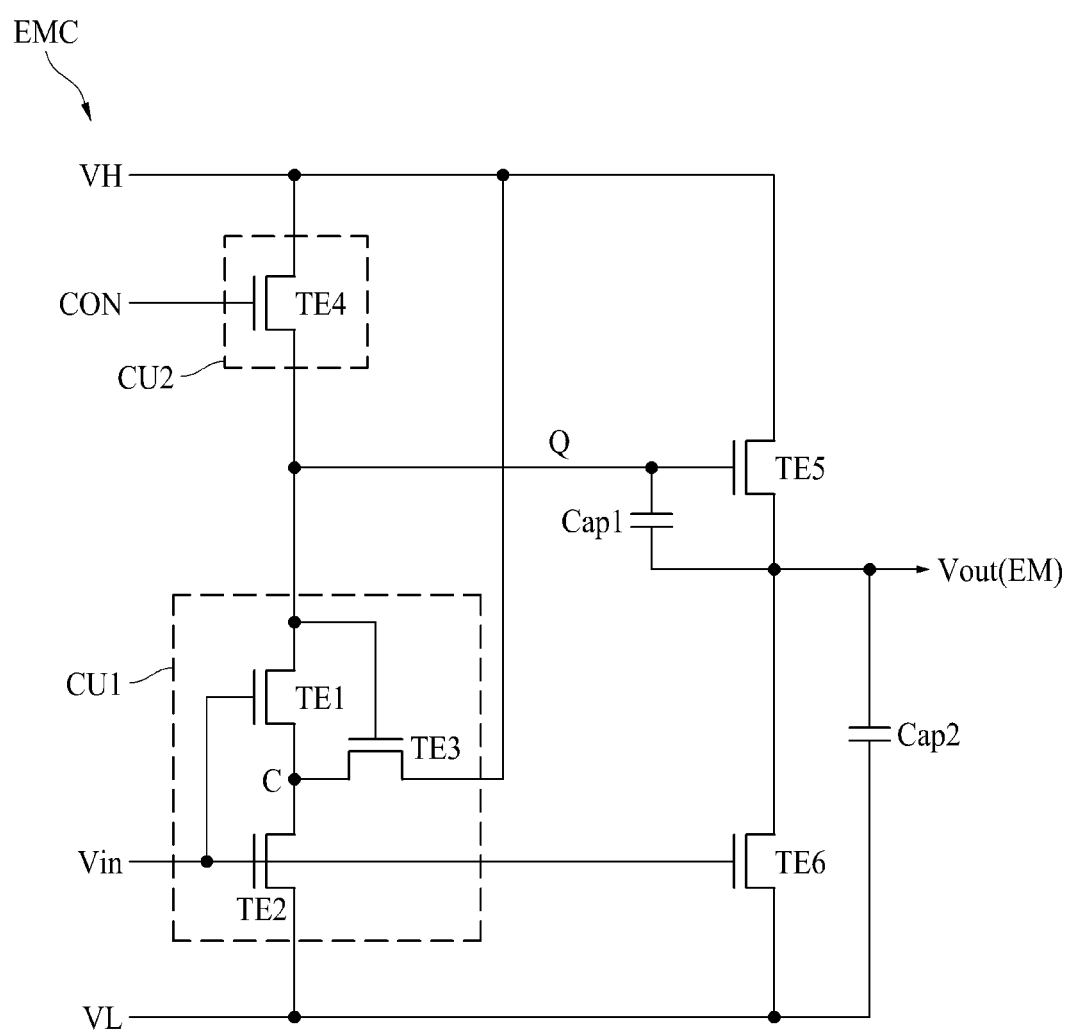
FIG. 23 is a circuit view illustrating an example of an emission control circuit according to one embodiment.

FIG. 23 is a circuit view illustrating one embodiment of an emission control circuit EMC.

The emission control circuit EMC of FIG. 23 may serve to invert an input voltage in accordance with a logic state of an internal control node to generate the inverted voltage. The emission control circuit EMC includes a pull-up transistor TE5, a pull-down transistor TE6, a first control unit CU1, and a second control unit CU2.

The pull-up transistor TE5 generates a high potential voltage VH of high logic as an output Vout in accordance with a logic state of a Q node. In detail, the pull-up transistor TE5 is turned on by high logic of the Q node to supply the high potential voltage VH as the output Vout.

The pull-down transistor TE6 generates a low potential voltage VL of low logic as the output Vout in accordance with a logic state of an input signal Vin. In detail, the pull-down transistor TE6 is turned on by high logic of the input signal Vin to supply the low potential voltage VL as the output Vout.

The first control unit CU1 discharges the Q node with low logic in accordance with the logic state of the input signal Vin. In detail, the first control unit CU1 discharges the Q node with the low potential voltage VL of low logic in response to the high logic of the input signal Vin, and blocks the low potential voltage VL in response to the low logic of the input signal Vin.

The first control unit CU1 includes first, second and third thin film transistors TE1, TE2 and TE3. The first and second thin film transistors TE1 and TE2 are connected in series between the Q node and a supply terminal of the low potential voltage VL, and connect the Q node with the supply terminal of the low potential voltage VL in response to the logic state of the input signal Vin. The third thin film transistor TE3 supplies an offset voltage to a connection node C of the first and second thin film transistors TE1 and TE2 in response to a logic state of a gate. The high potential voltage VH may be supplied as the offset voltage.

The second control unit CU2 charges the Q node with high logic in accordance with a logic state of a control signal CON. In detail, the second control unit CU2 charges the Q node with the high potential voltage VH of high logic in response to the high logic of the control signal CON.

The second control unit CU2 includes a charging transistor TE4 for charging the Q node with the high potential voltage VH in response to the high logic of the control signal CON. The charging transistor TE4 of the second control unit CU2 is directly connected to a drain of the first thin film transistor TE1 and the gate of the third thin film transistor TE3 in the Q node.

The input signal Vin and the control signal CON may have pulse shapes that do not overlap each other, and a clock may be used as the control signal CON.

The emission control circuit EMC inverts the input signal Vin in accordance with the logic state of the Q node and generates the inverted input signal as the output Vout. In general, the emission control circuit EMC generates the output Vout of high logic through the pull-up transistor TE5 when the Q node is high logic and the input signal Vin is low logic, and generates the output Vout of low logic through the pull-down transistor TE6 when the Q node is low logic and the input signal Vin is high logic.

The control signal CON controls the timing when the emission control circuit EMC generates the output Vout of inversion logic for the input signal Vin. In particular, when the input signal Vin is changed from high logic to low logic, the output Vout should be changed from low logic to high logic, but the control signal CON may adjust the timing when the output Vout is changed from low logic to high logic. Even though the input signal Vin is changed from high logic to low logic, when the control signal CON is low logic, the output Vout remains in the previous logic state, and when the control signal CON is high logic, the output Vout is changed to high logic.

In addition, the emission control circuit EMC includes a first capacitor Cap1 connected between the gate-source of the pull-up transistor TE5 to bootstrap the Q node in accordance with high logic supplied to an output Vout node, and a second capacitor Cap2 connected between the output Vout node and the supply terminal of the low potential voltage VL to stably maintains a voltage of the output Vout node. As the voltage of the Q node is increased by bootstrapping of the first capacitor Cap1, the voltage of the output Vout node may be also increased.

The emission control circuit EMC as shown in FIG. 23 occupies a large area of a large number of thin film transistors.

In the GIP structure in which the gate driver 320 is disposed on the same base substrate 110 as the pixel P, it is required that the gate driver 320 should have a small area as possible. Therefore, it is preferable that the thin film transistors TE1, TE2, TE3, TE4, TE5 and TE6 disposed in the gate driver 320 have a small area.

In order to reduce the area of the gate driver 320, the first thin film transistor TFT1 of the above-described thin film transistor substrates 100, 200, 300, 400, 500, 600, 700, 800, 900, 1000 and 1100, which may be driven even in a small area due to high mobility characteristics, may be used as the thin film transistor of the gate driver 320, but one embodiment of the present disclosure is not limited thereto, and the second thin film transistor TFT2 may be applied to the thin film transistor of the gate driver 320.

According to the present disclosure, the following advantageous effects may be obtained.

According to one embodiment of the present disclosure, as the thin film transistor having high mobility and high current characteristics and the thin film transistor having excellent stability are used together depending on purposes of use, arrangement efficiency of the thin film transistor in the display device may be improved.

According to one embodiment of the present disclosure, the thin film transistor having high mobility and high current characteristics may be disposed in the gate driver to reduce an area of the gate driver.

According to one embodiment of the present disclosure, as the thin film transistor having high mobility and high current characteristics is applied to a switching transistor of a pixel, switching characteristics of the pixel may be improved, and the area of the thin film transistor disposed in the pixel may be reduced.

According to one embodiment of the present disclosure, as the thin film transistor having excellent stability is applied to the pixel, display quality of the display device may be improved, and stability of display quality may be improved.

According to one embodiment of the present disclosure, a large number of thin film transistors may be disposed in the same area.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor substrate comprising:
a first thin film transistor on a base substrate, the first thin film transistor including a first active layer on the base substrate and a first gate electrode that is spaced apart from the first active layer;
a second thin film transistor on the base substrate, the second thin film transistor including a second active layer on the base substrate and a second gate electrode that is spaced apart from the second active layer, wherein a mobility of the first active layer is greater than a mobility of the second active layer;
a first gate insulating layer that is between the first active layer and the first gate electrode, and the first gate insulating layer between the second active layer and the second gate electrode; and
a second gate insulating layer that is between the second active layer and the second gate electrode and is between the first active layer and the base substrate.

2. The thin film transistor substrate of claim 1, wherein the mobility of the first active layer is 5 to 45 $cm^2/V \cdot s$ greater than the mobility of the second active layer.

3. The thin film transistor substrate of claim 1, wherein the first active layer includes a first oxide semiconductor layer and a second oxide semiconductor layer, and a mobility of the first oxide semiconductor layer is greater than a mobility of the second oxide semiconductor layer.

4. The thin film transistor substrate of claim 3, wherein the first oxide semiconductor layer is closer to the first gate electrode than the second oxide semiconductor layer.

5. The thin film transistor substrate of claim 3, wherein the second oxide semiconductor layer is closer to the first gate electrode than the first oxide semiconductor layer.

6. The thin film transistor substrate of claim 5, wherein the second oxide semiconductor layer covers an upper surface and a lateral surface of the first oxide semiconductor layer that extends from the upper surface.

7. The thin film transistor substrate of claim 3, wherein the first active layer further includes a third oxide semiconductor layer.

8. The thin film transistor substrate of claim 7, wherein the third oxide semiconductor layer is in contact with the first oxide semiconductor layer.

9. The thin film transistor substrate of claim 7, wherein the third oxide semiconductor layer covers an upper surface and a lateral surface of the first oxide semiconductor layer and an upper surface and a lateral surface of the second oxide semiconductor layer.

10. The thin film transistor substrate of claim 1, wherein the second active layer is on a same layer as the first active layer,
the first active layer includes a first oxide semiconductor layer and a second oxide semiconductor layer, and a mobility of the first oxide semiconductor layer is greater than a mobility of the second oxide semiconductor layer, and
the second active layer has a same composition as the second oxide semiconductor layer of the first active layer.

11. The thin film transistor substrate of claim 10, wherein the second active layer is on a same layer as the second oxide semiconductor layer.

12. The thin film transistor substrate of claim 10, wherein the second oxide semiconductor layer of the first active layer covers an upper surface and a lateral surface of the first oxide semiconductor layer.

13. The thin film transistor substrate of claim 10, wherein the mobility of the first active layer is 5 to 45 cm$^2$/V·s greater than the mobility of the second active layer.

14. A display device comprising the thin film transistor substrate of claim 1.

15. The display device of claim 14, further comprising:
a pixel and a gate driver on the base substrate,
wherein the gate driver includes at least one of the first thin film transistor or the second thin film transistor.

16. The display device of claim 15, wherein the pixel includes a pixel driving circuit, and the pixel driving circuit including the first thin film transistor and the second thin film transistor.

17. The display device of claim 16, wherein the first thin film transistor of the pixel driving circuit is a switching transistor.

18. The display device of claim 16, wherein the second thin film transistor of the pixel driving circuit is a driving transistor.

19. The display device of claim 16, wherein the second thin film transistor of the pixel driving circuit is an emission control transistor.

20. A thin film transistor substrate comprising:
a first thin film transistor on a base substrate, the first thin film transistor including a first active layer on the base substrate and a first gate electrode that is spaced apart from the first active layer, the first active layer including a first oxide semiconductor layer and a second oxide semiconductor layer on the first oxide semiconductor layer such that the second oxide semiconductor layer is farther from the base substrate than the first oxide semiconductor layer; and
a second thin film transistor on the base substrate, the second thin film transistor including a second active layer on the base substrate and a second gate electrode that is spaced apart from the second active layer, the second active layer including a first oxide semiconductor layer and a second oxide semiconductor layer on the first oxide semiconductor layer of the second thin film transistor such that the second oxide semiconductor layer of the second thin film transistor is farther from the base substrate than the first oxide semiconductor layer of the second thin film transistor;
wherein a mobility of the first oxide semiconductor layer of the first active layer and a mobility of the first oxide semiconductor layer of the second active layer are greater than a mobility of the second oxide semiconductor layer of the first active layer and a mobility of the second oxide semiconductor layer of the second active layer,
wherein the first gate electrode in the first thin film transistor is closer to the first oxide semiconductor layer of the first active layer such that the first oxide semiconductor layer of the first thin film transistor is between the first gate electrode and the second oxide semiconductor layer of the first thin film transistor than the second oxide semiconductor layer of the first active layer, and the second gate electrode in the second thin film transistor is closer to the second oxide semiconductor layer of the second active layer than the first oxide semiconductor layer of the second active layer such that the second oxide semiconductor layer of the second thin film transistor is between the second gate electrode and the first oxide semiconductor layer of the second thin film transistor.

21. The thin film transistor substrate of claim 20, wherein the first oxide semiconductor layer of the first active layer and the first oxide semiconductor layer of the second active layer are on a same layer, and the second oxide semiconductor layer of the first active layer and the second oxide semiconductor layer of the second active layer are on a same layer.

22. The thin film transistor substrate of claim 20, wherein the first gate electrode is disposed on a side of the first active layer and the second gate electrode is disposed on a side of the second active layer that is opposite the side of the first active layer.

23. The thin film transistor substrate of claim 22, wherein the first gate electrode is disposed between the base substrate and the first active layer.

24. The thin film transistor substrate of claim 22, wherein the second gate electrode is disposed between the base substrate and the second active layer.

25. A thin film transistor substrate comprising:
a first thin film transistor on a base substrate, the first thin film transistor including a first active layer on the base substrate and a first gate electrode that is spaced apart from the first active layer, the first active layer including a first oxide semiconductor layer and a second oxide semiconductor layer, and the first oxide semiconductor layer is farther from the base substrate than the second oxide semiconductor layer; and
a second thin film transistor on the base substrate, the second thin film transistor including a second active layer on the base substrate and a second gate electrode that is spaced apart from the second active layer, the second active layer including a first oxide semiconductor layer and a second oxide semiconductor layer, the first oxide semiconductor layer of the second thin film transistor is farther from the base substrate than the second oxide semiconductor layer of the second thin film transistor;
wherein a mobility of the first oxide semiconductor layer of the first active layer and a mobility of the first oxide semiconductor layer of the second active layer are greater than a mobility of the second oxide semiconductor layer of the first active layer and a mobility of the second oxide semiconductor layer of the second active layer,
wherein the first gate electrode in the first thin film transistor is closer to the first oxide semiconductor layer of the first active layer than the second oxide semiconductor layer of the first active layer such that the first oxide semiconductor layer of the first thin film transistor is between the first gate electrode and the second oxide semiconductor layer of the first thin film transistor, and the second gate electrode in the second thin film transistor is closer to the second oxide semiconductor layer of the second active layer than the first oxide semiconductor layer of the second active layer such that the second oxide semiconductor layer of the second thin film transistor is between the second gate electrode and the first oxide semiconductor layer of the second thin film transistor.

* * * * *